(12) United States Patent
Shimura et al.

(10) Patent No.: US 10,347,338 B2
(45) Date of Patent: Jul. 9, 2019

(54) MEMORY DEVICE AND MEMORY CONTROLLER

(71) Applicant: Toshiba Memory Corporation, Minato-ku (JP)

(72) Inventors: Yasuhiro Shimura, Yokohama (JP); Tomoki Higashi, Yokohama (JP); Sumito Ohtsuki, Yokohama (JP); Junichi Kijima, Kawasaki (JP); Keisuke Yonehama, Kamakura (JP); Shinichi Oosera, Yokohama (JP); Yuki Kanamori, Kamakura (JP); Hidehiro Shiga, Yokohama (JP); Koki Ueno, Yokohama (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/699,370

(22) Filed: Sep. 8, 2017

(65) Prior Publication Data

US 2018/0268906 A1    Sep. 20, 2018

(30) Foreign Application Priority Data

Mar. 17, 2017    (JP) .................................. 2017-052671

(51) Int. Cl.
*G11C 16/04*    (2006.01)
*G11C 16/08*    (2006.01)
(Continued)

(52) U.S. Cl.
CPC .......... *G11C 16/08* (2013.01); *G11C 11/5642* (2013.01); *G11C 16/0483* (2013.01);
(Continued)

(58) Field of Classification Search
CPC ..... G11C 16/08; G11C 16/0483; G11C 16/26; G11C 16/30; G11C 16/32
(Continued)

(56) References Cited

U.S. PATENT DOCUMENTS

2003/0161182 A1    8/2003    Li et al.
2014/0140148 A1*    5/2014    An ...................... G11C 11/5642
                                                                            365/189.14
(Continued)

FOREIGN PATENT DOCUMENTS

JP    2004-30866    1/2004
JP    2014-170598    9/2014
JP    2016-170835    9/2016

*Primary Examiner* — Huan Hoang
(74) *Attorney, Agent, or Firm* — Oblon, McClelland, Maier & Neustadt, L.L.P.

(57) ABSTRACT

According to one embodiment, a memory controller transmits a first instruction to a memory device. The memory device includes cell transistors; word lines coupled to gates of the cell transistors; a first data latch; and a second latch. The first instruction instructs application of a positive voltage to one of the word lines. The memory controller transmits a second instruction after the transmission of the first instruction and before transmitting a third instruction. The third instruction instructs output of data from the memory device. The second instruction is different from the third instruction and a fourth instruction instructing copy of data from the first data latch to the second data latch.

19 Claims, 33 Drawing Sheets

(51) Int. Cl.
  *G11C 16/30*   (2006.01)
  *G11C 16/26*   (2006.01)
  *G11C 16/32*   (2006.01)
  *G11C 11/56*   (2006.01)
  *G11C 7/20*   (2006.01)

(52) U.S. Cl.
  CPC .............. *G11C 16/26* (2013.01); *G11C 16/30* (2013.01); *G11C 16/32* (2013.01); *G11C 7/20* (2013.01)

(58) Field of Classification Search
  USPC .................................................... 365/185.11
  See application file for complete search history.

(56) References Cited

U.S. PATENT DOCUMENTS

| | | |
|---|---|---|
| 2014/0247658 A1 | 9/2014 | Hosono |
| 2016/0163394 A1 | 6/2016 | Yoo et al. |
| 2016/0267990 A1 | 9/2016 | Bushnaq et al. |
| 2018/0129431 A1* | 5/2018 | Yang ..................... G06F 3/0619 |

* cited by examiner

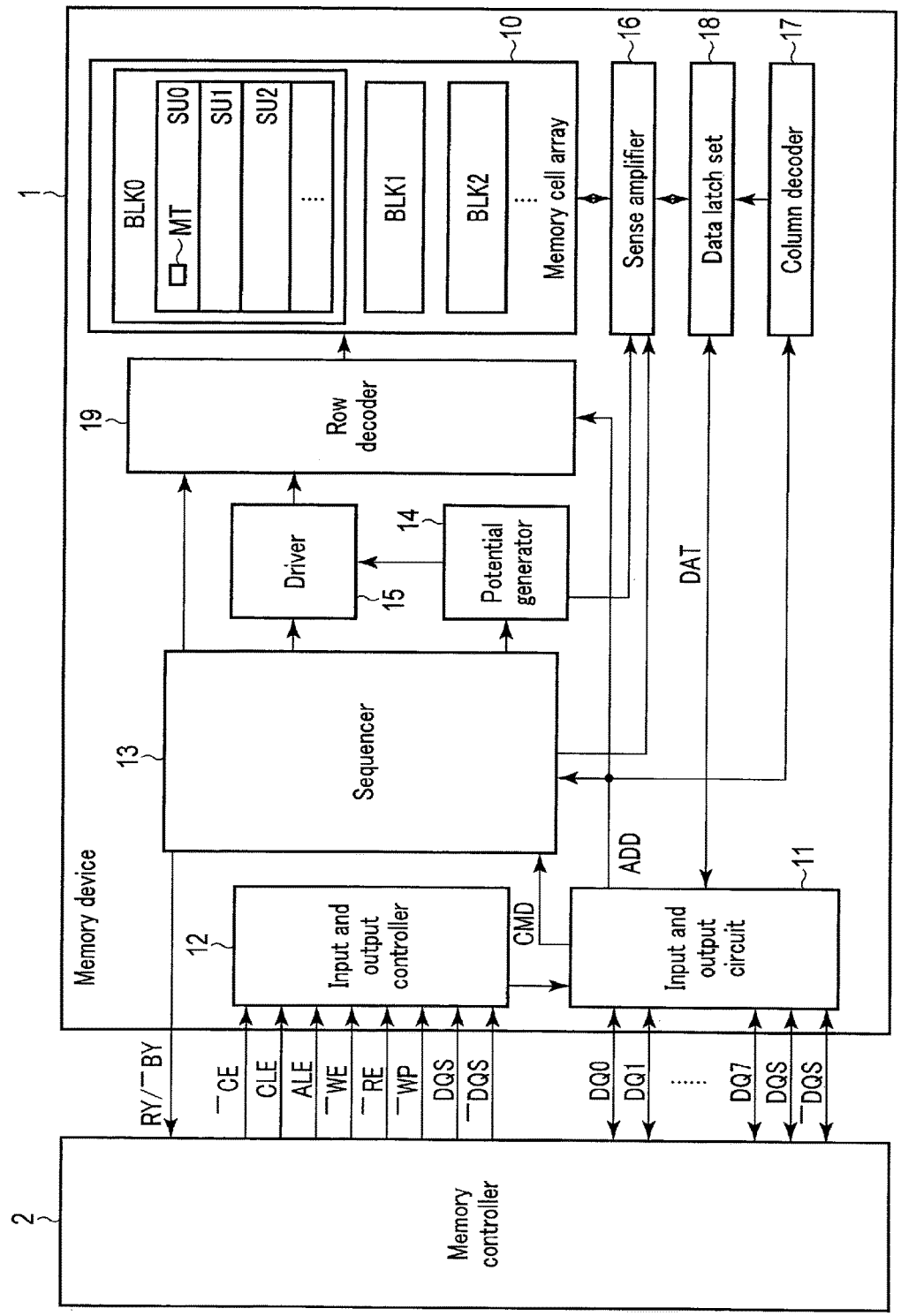
F I G. 2

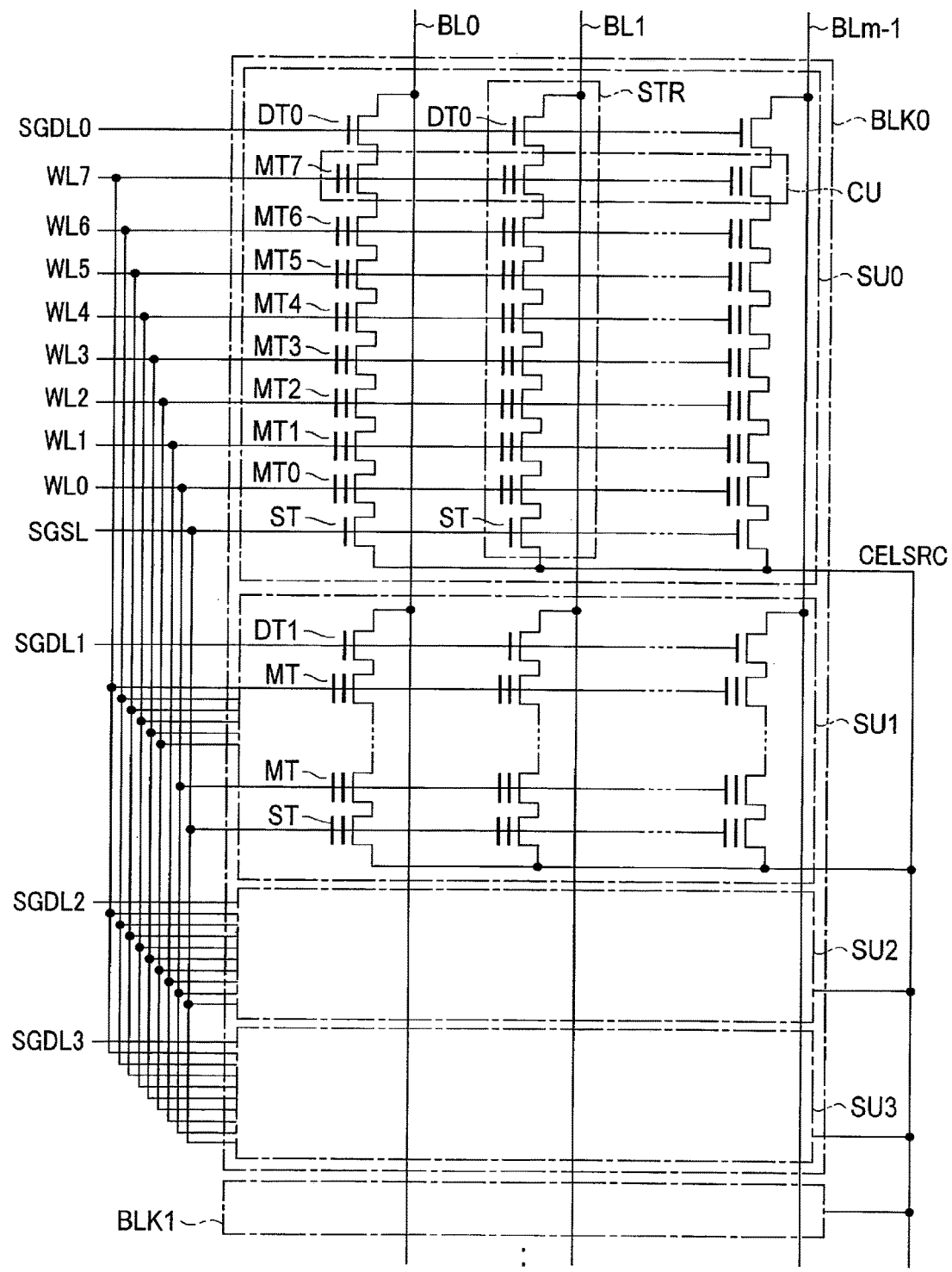
F I G. 3

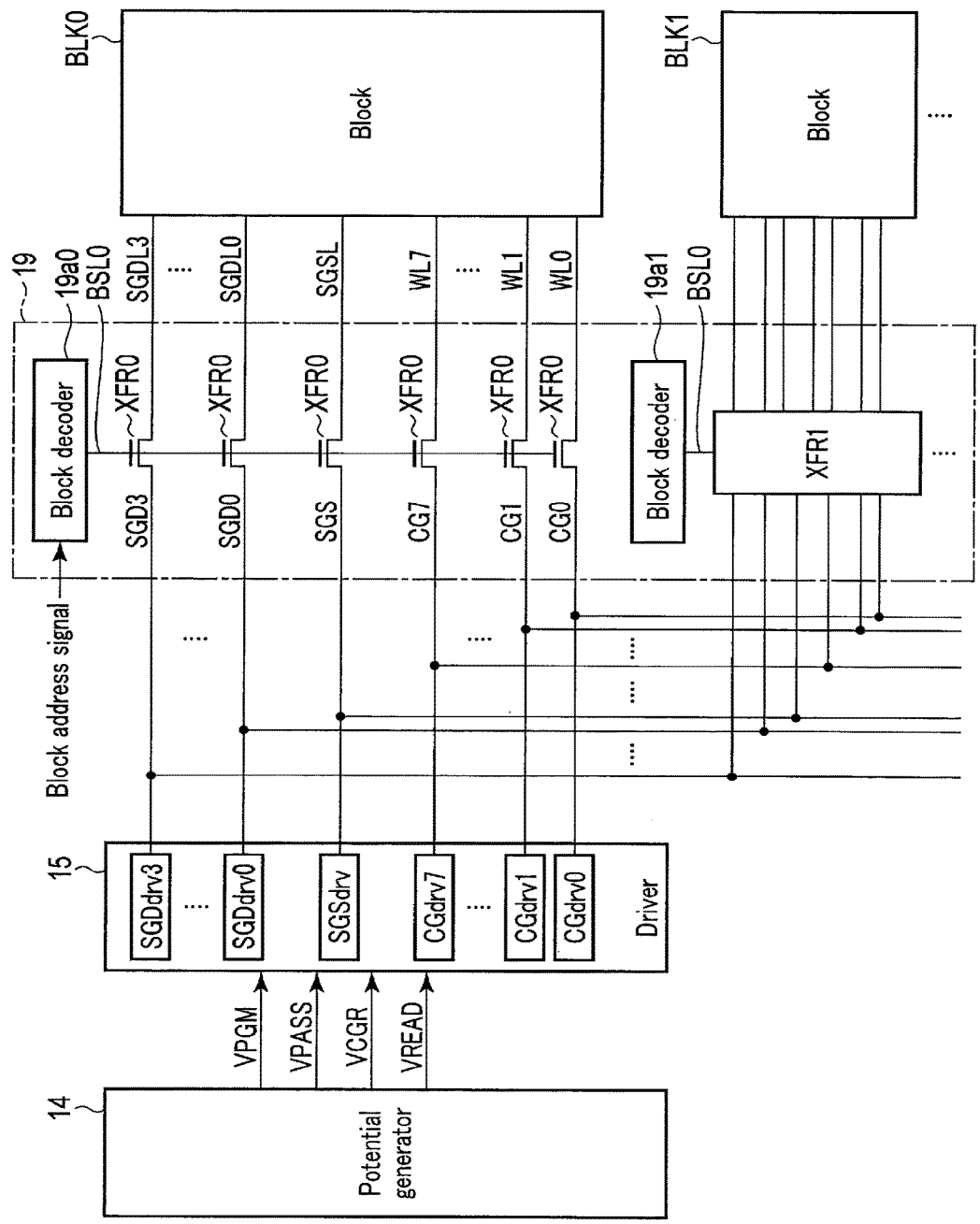
F I G. 6

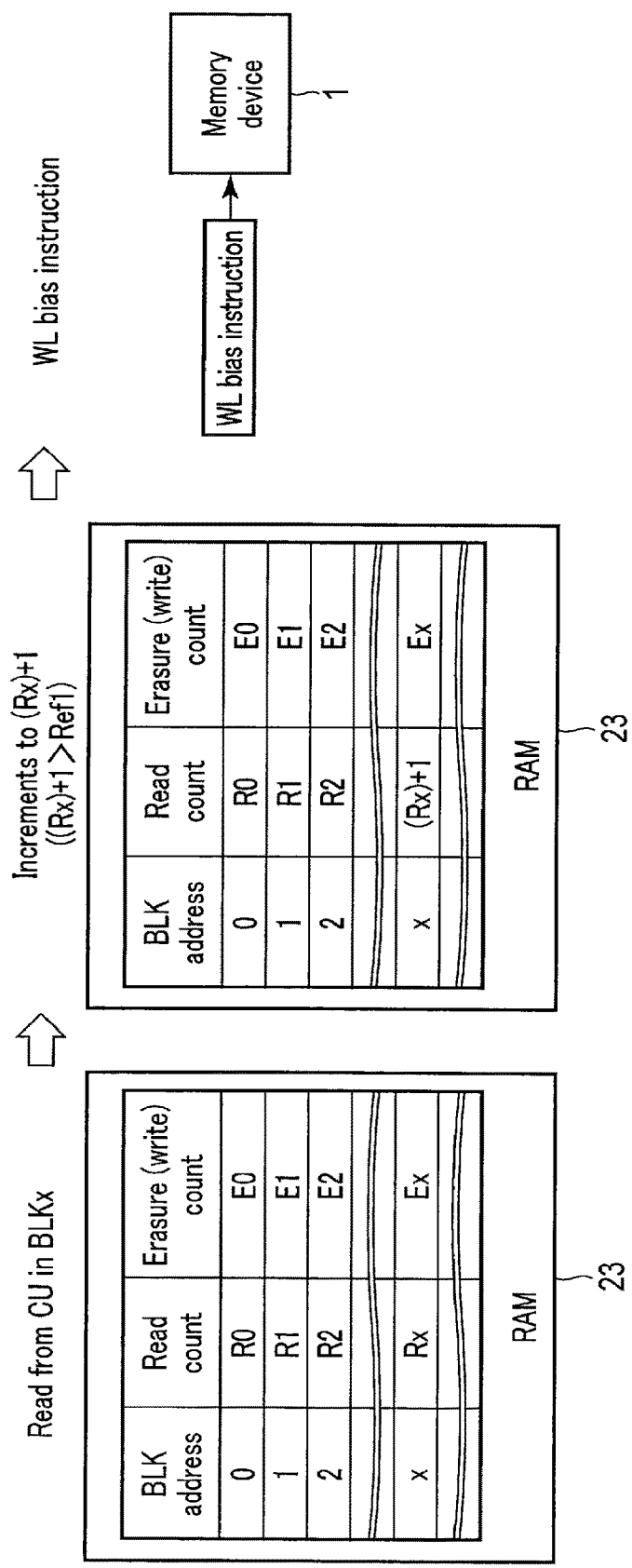
F I G. 9

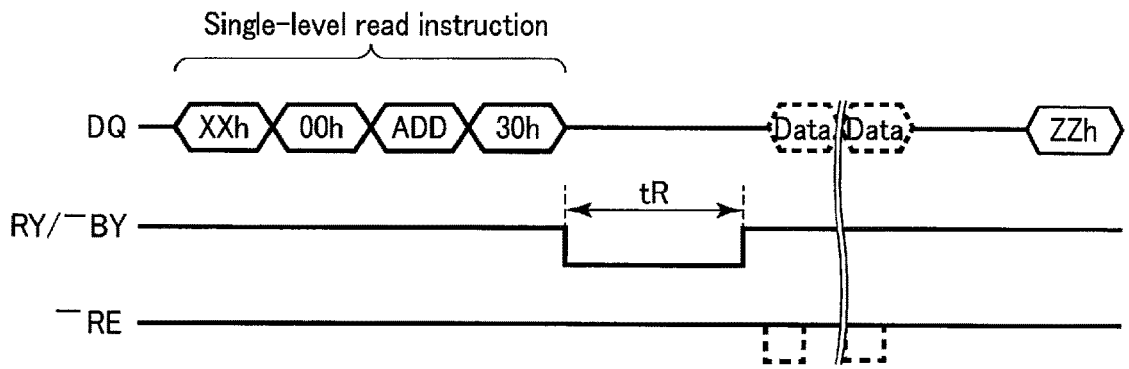
F I G. 12
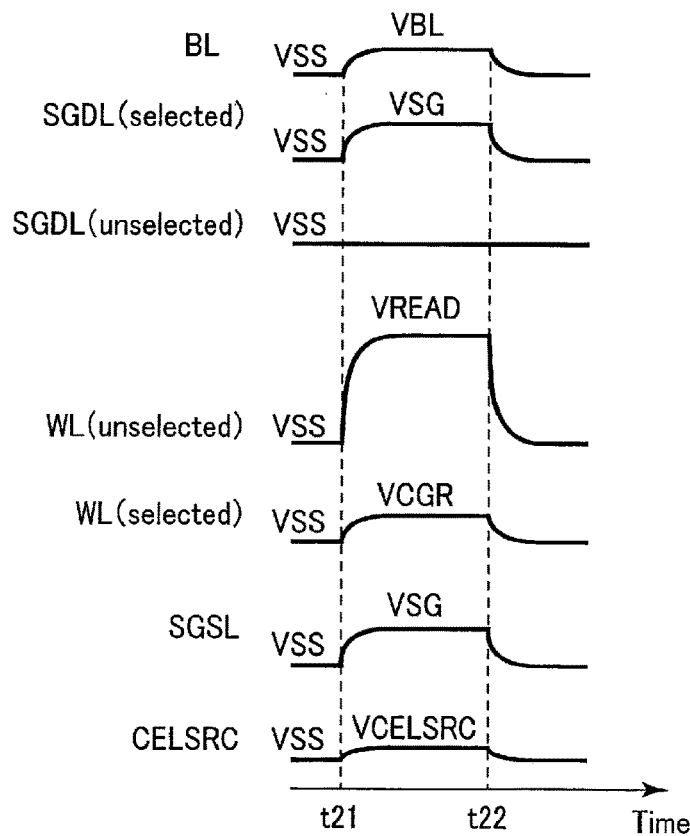
F I G. 13

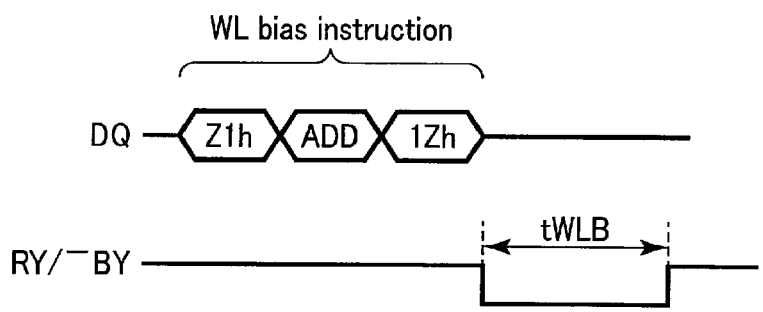
F I G. 14
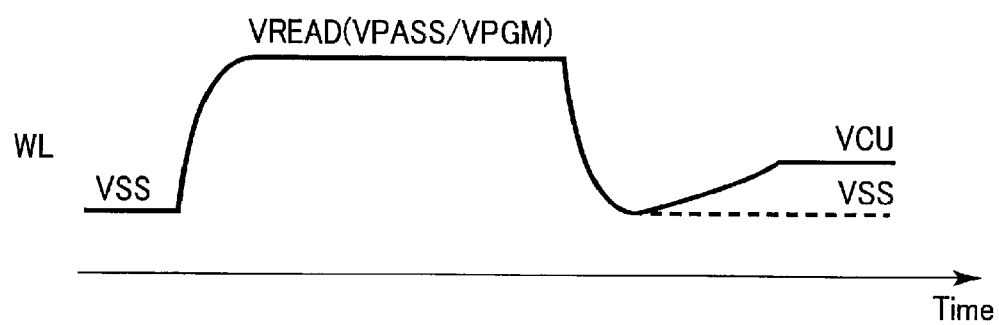
F I G. 15

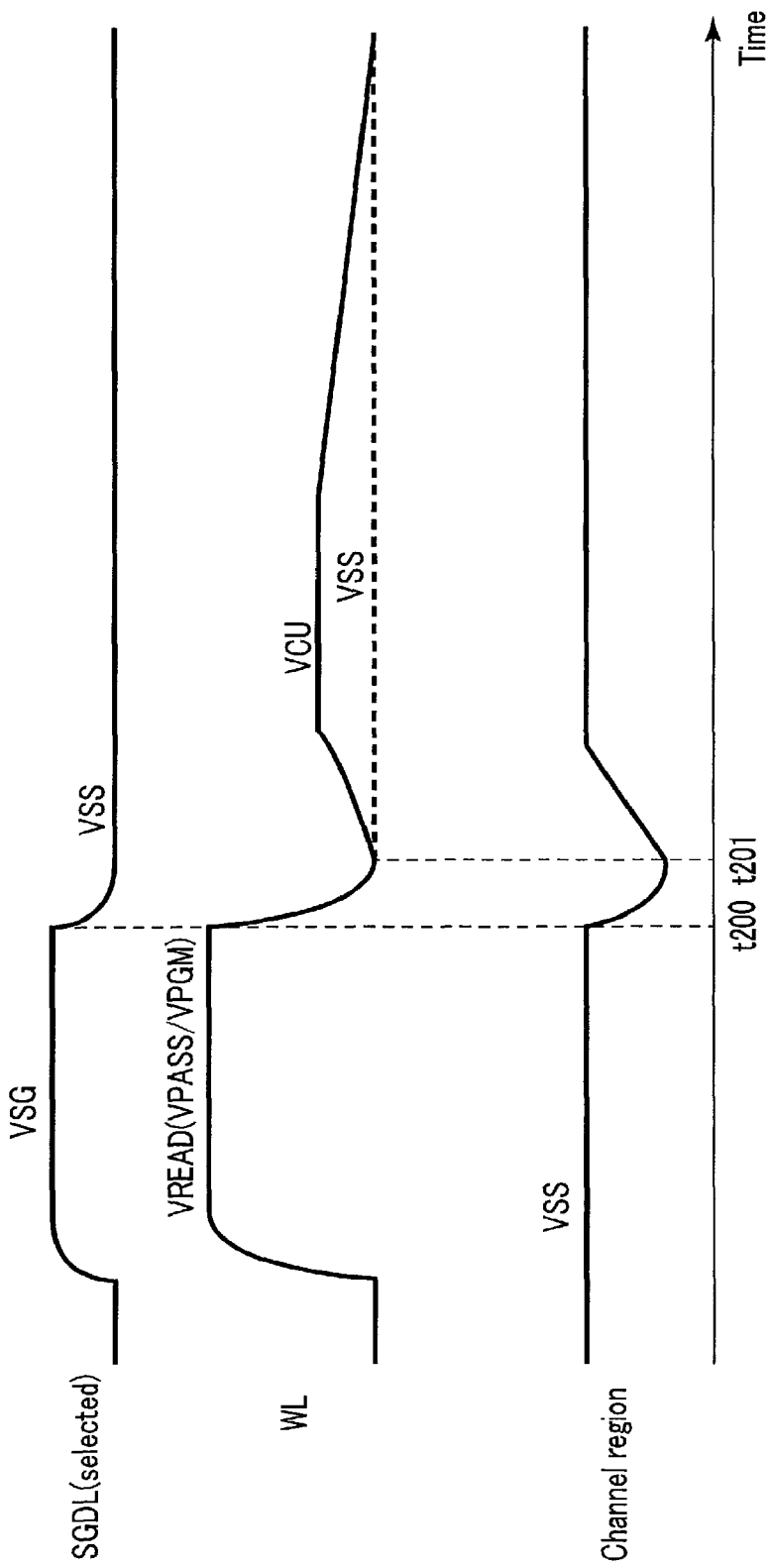
F I G. 16

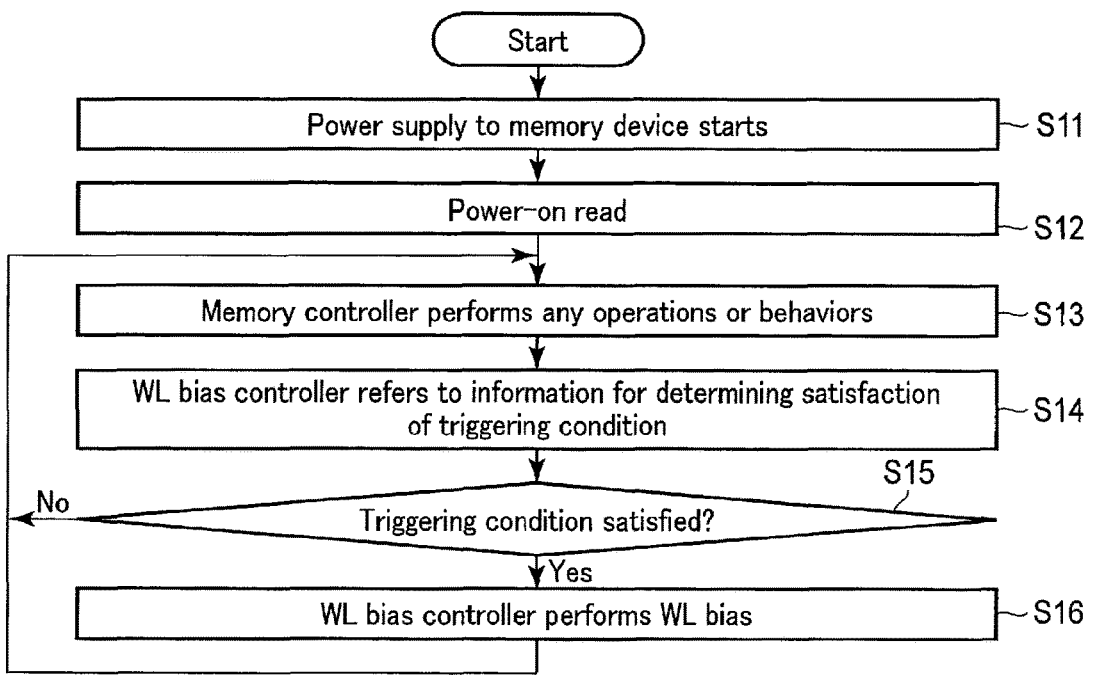
F I G. 20

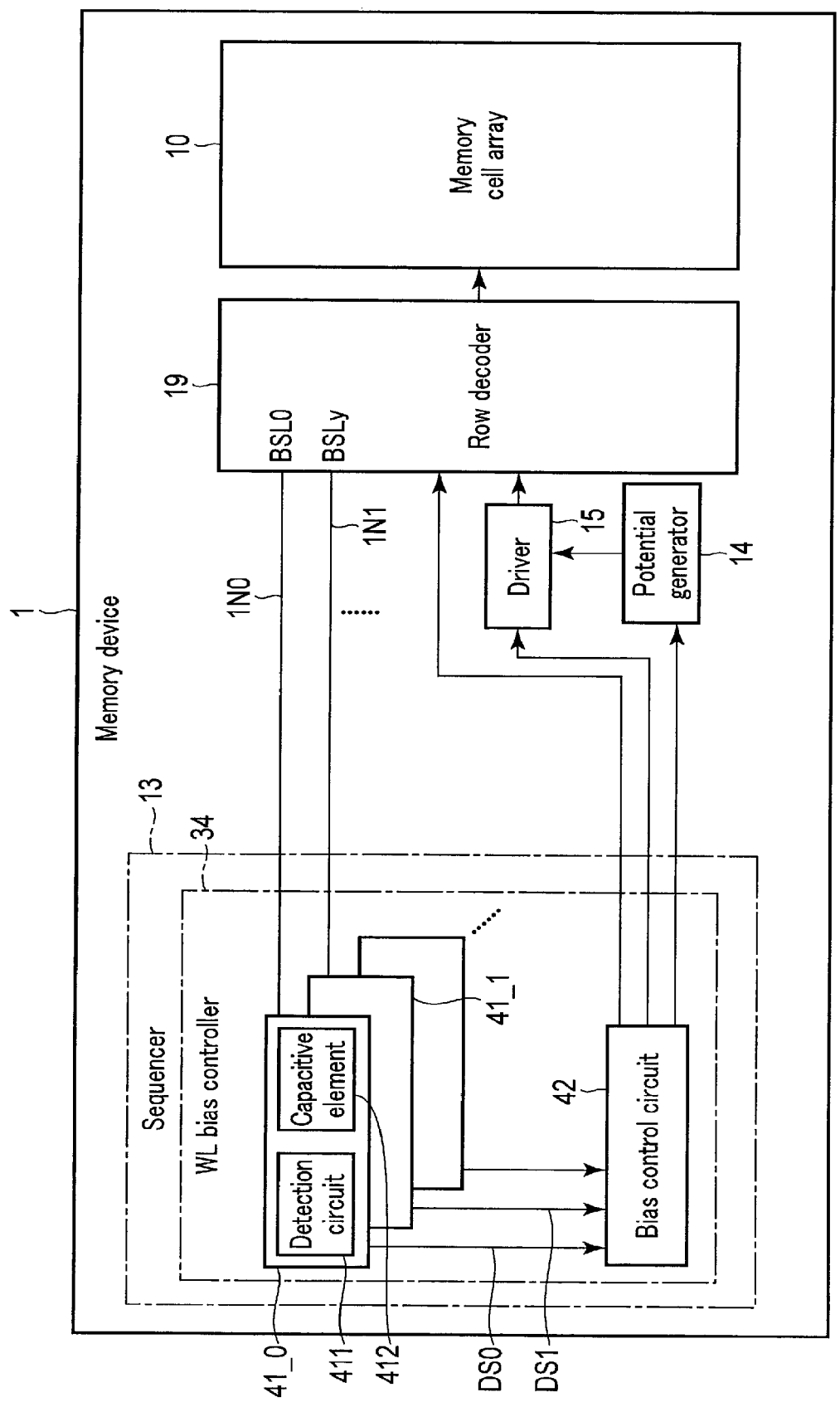
F I G. 21

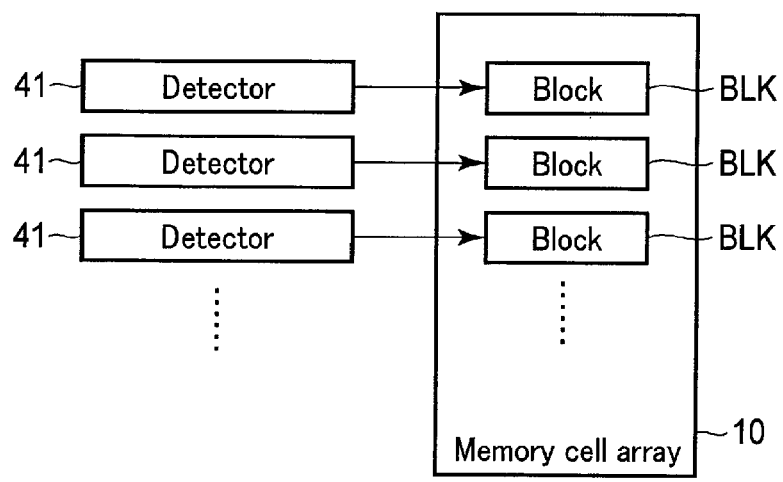
F I G. 22
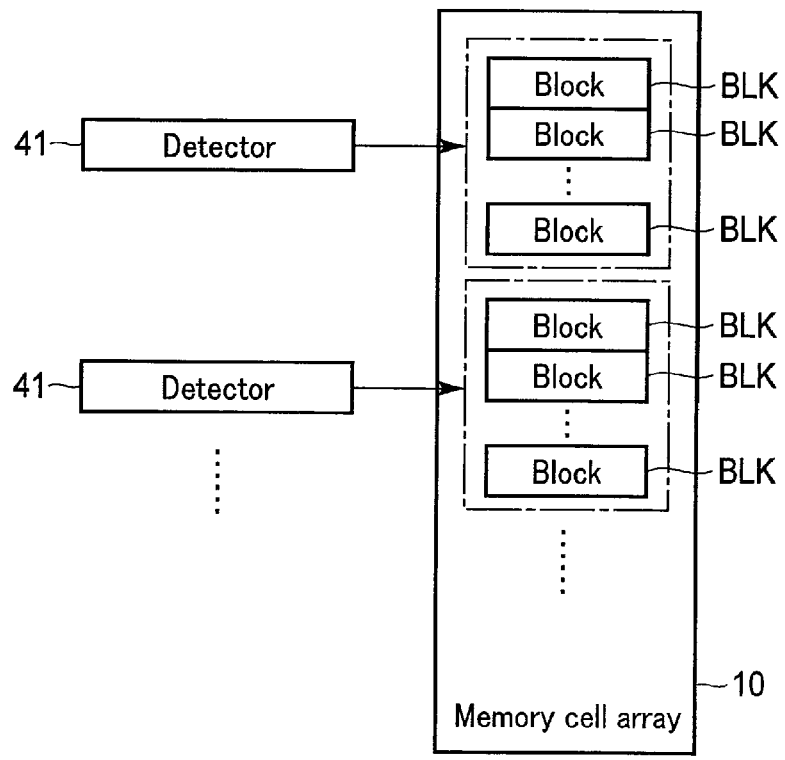
F I G. 23

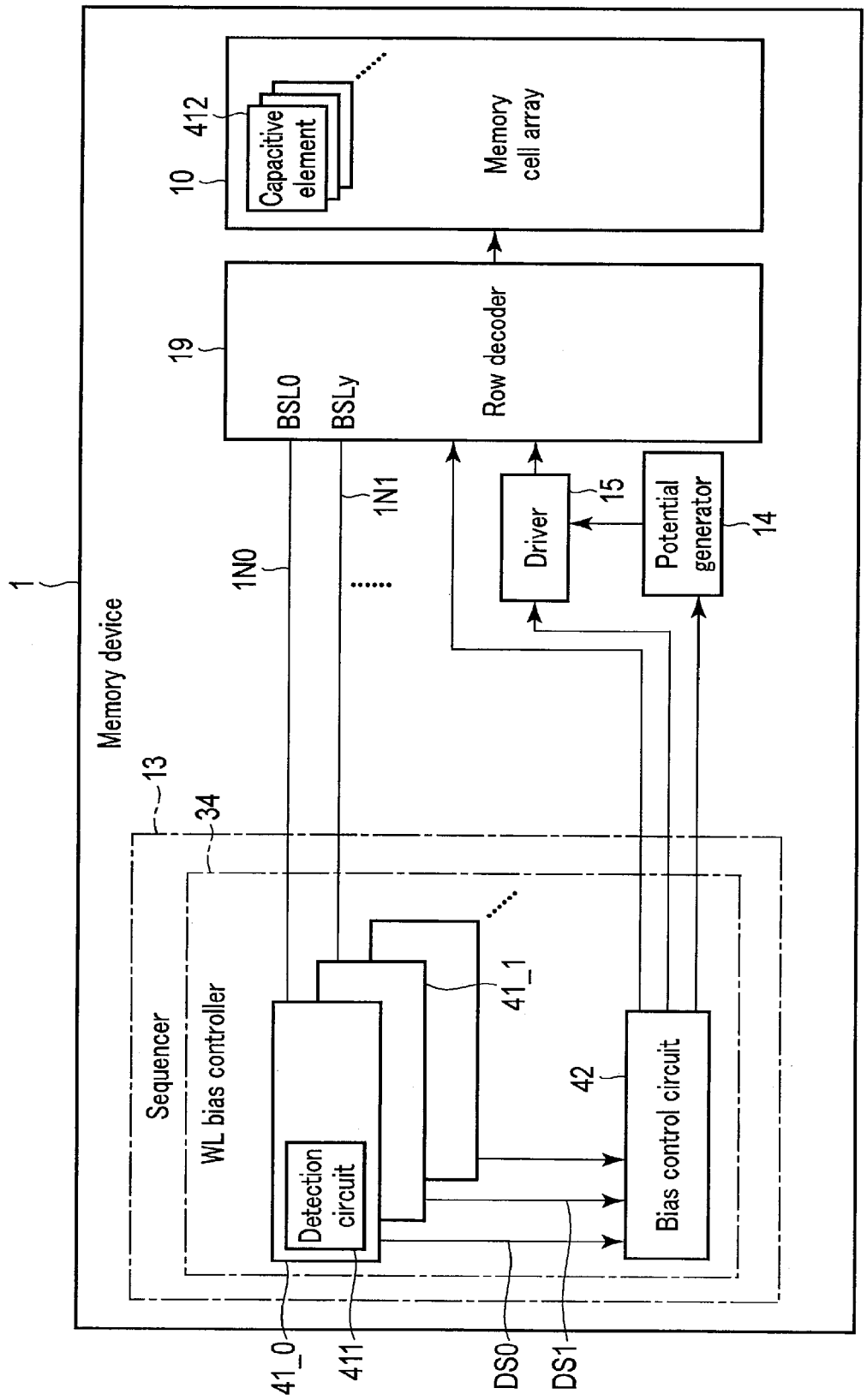
F I G. 24

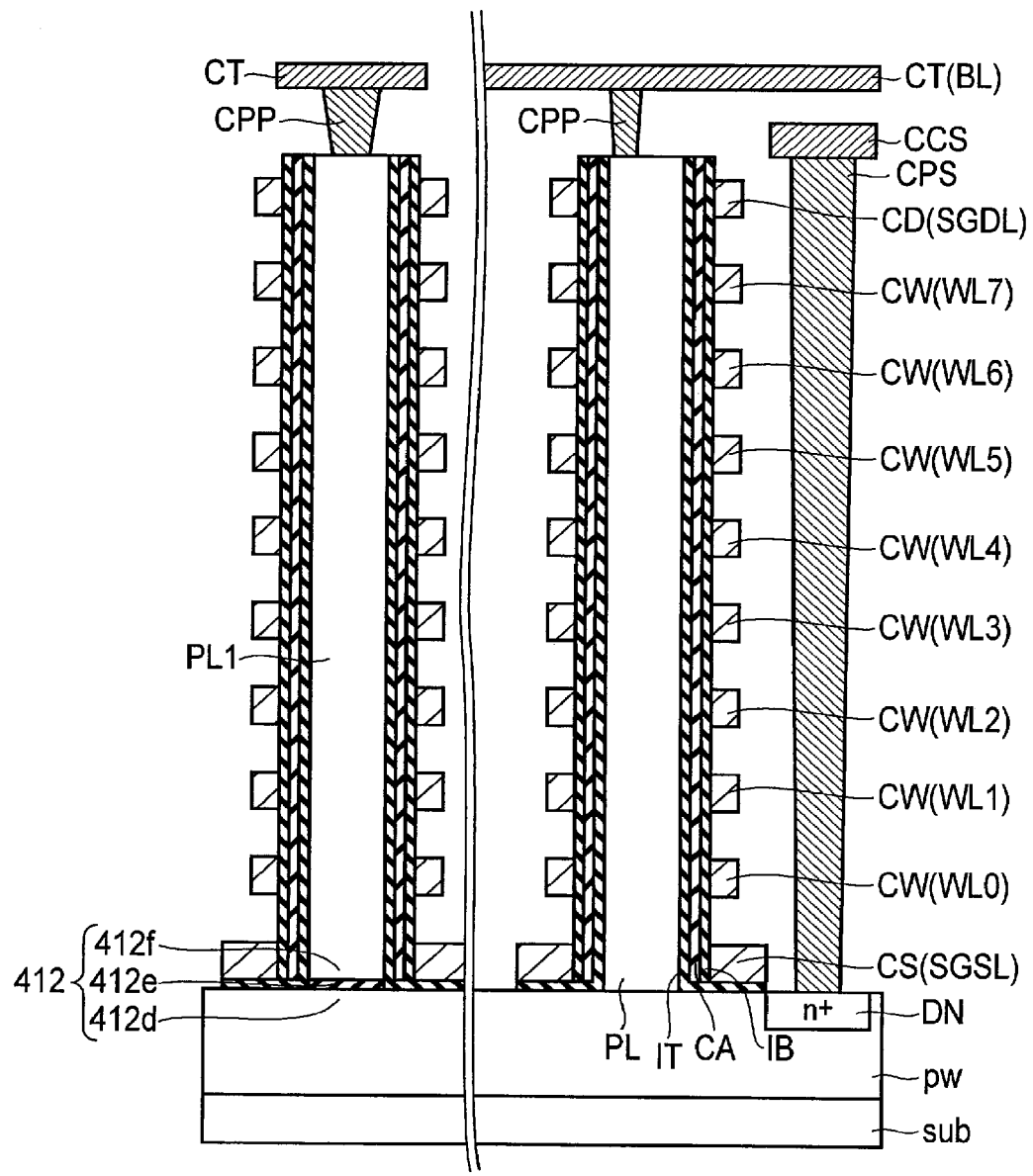
F I G. 29

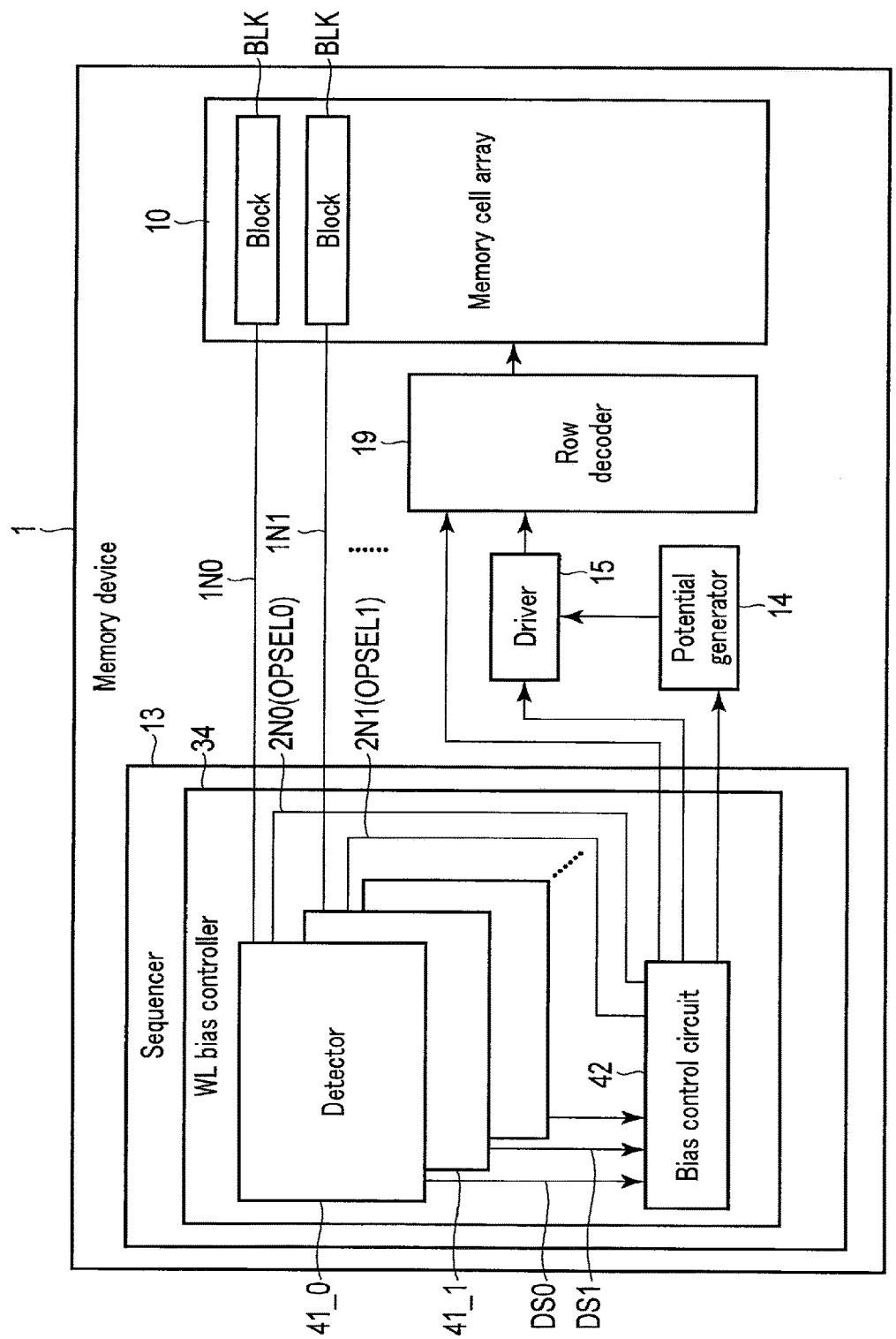
F I G. 30

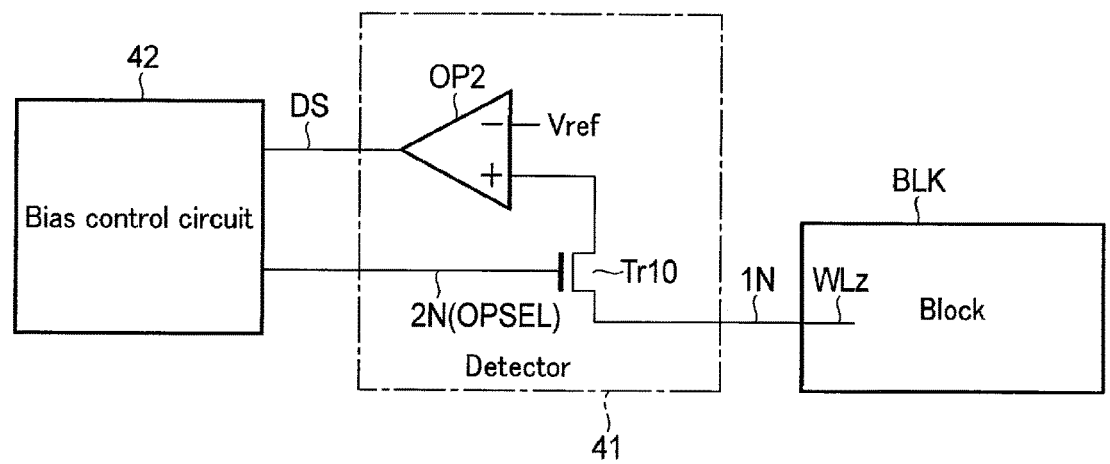
F I G. 31
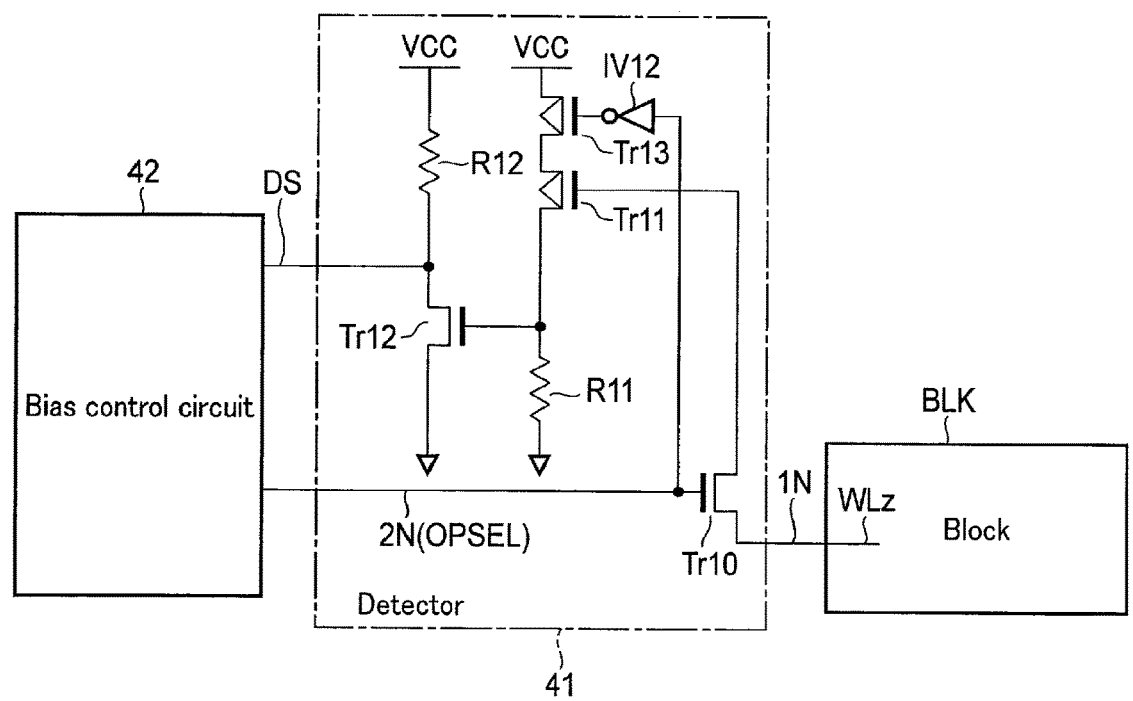
F I G. 32

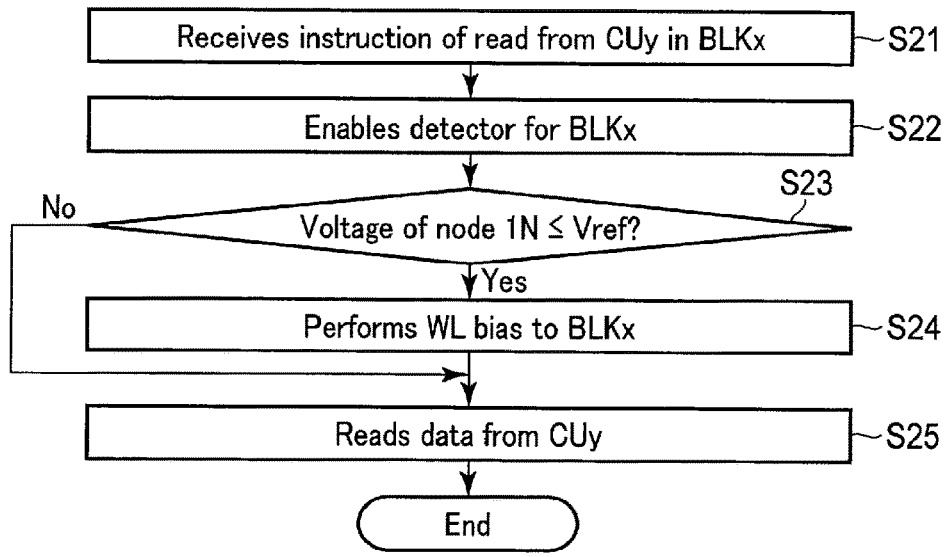
F I G. 33
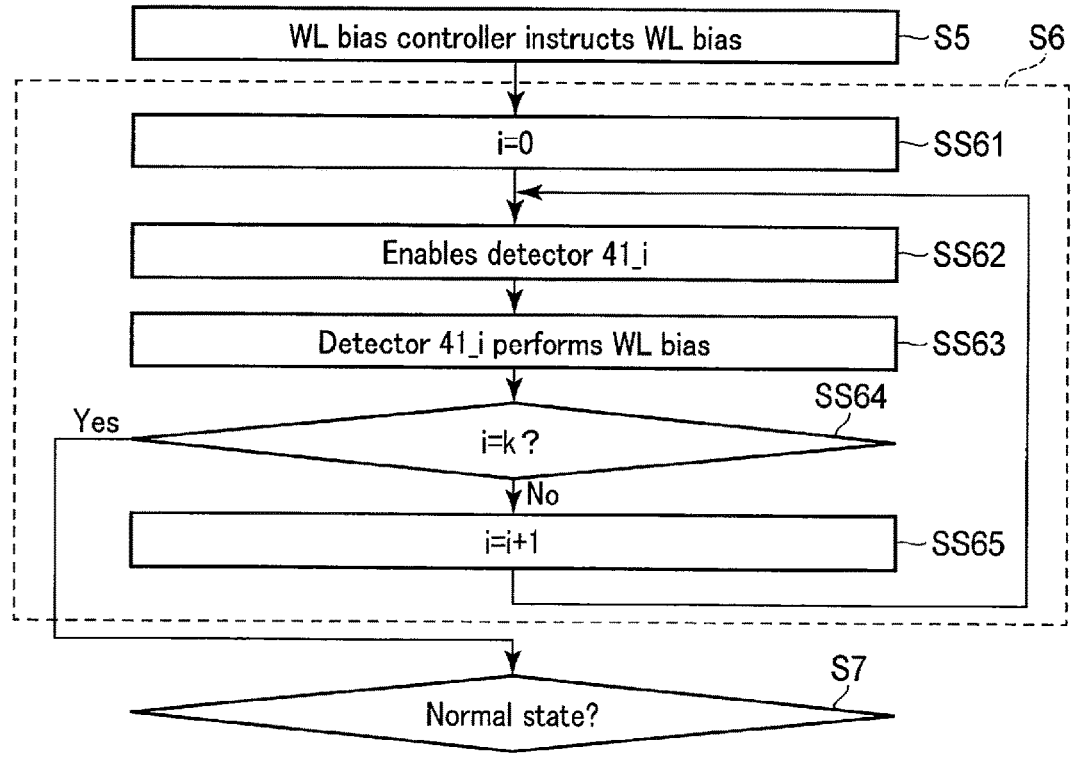
F I G. 34

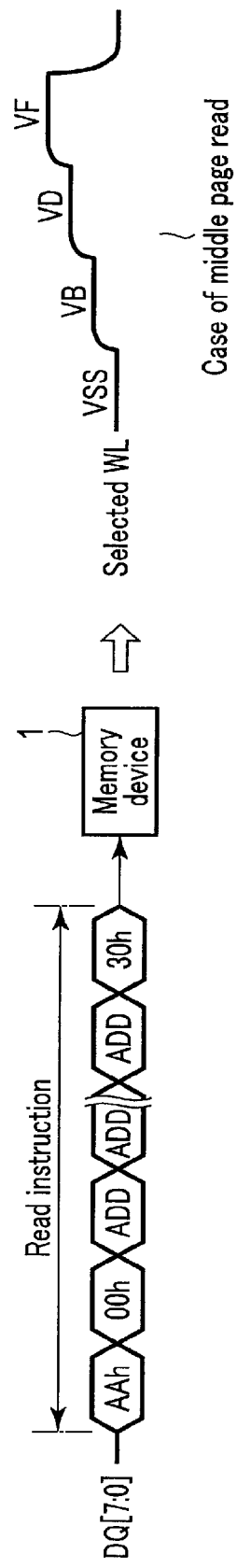
F I G. 35

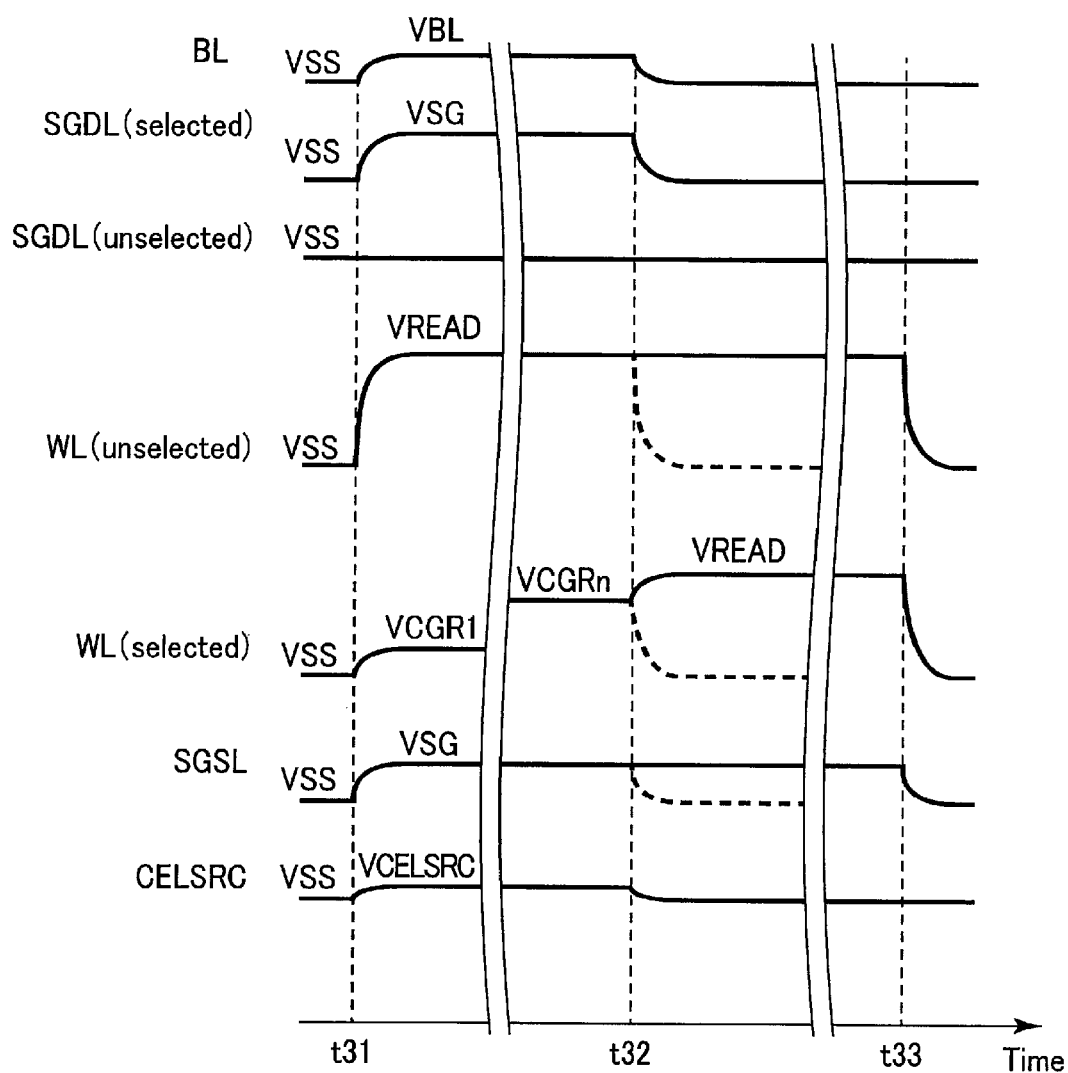
F I G. 36

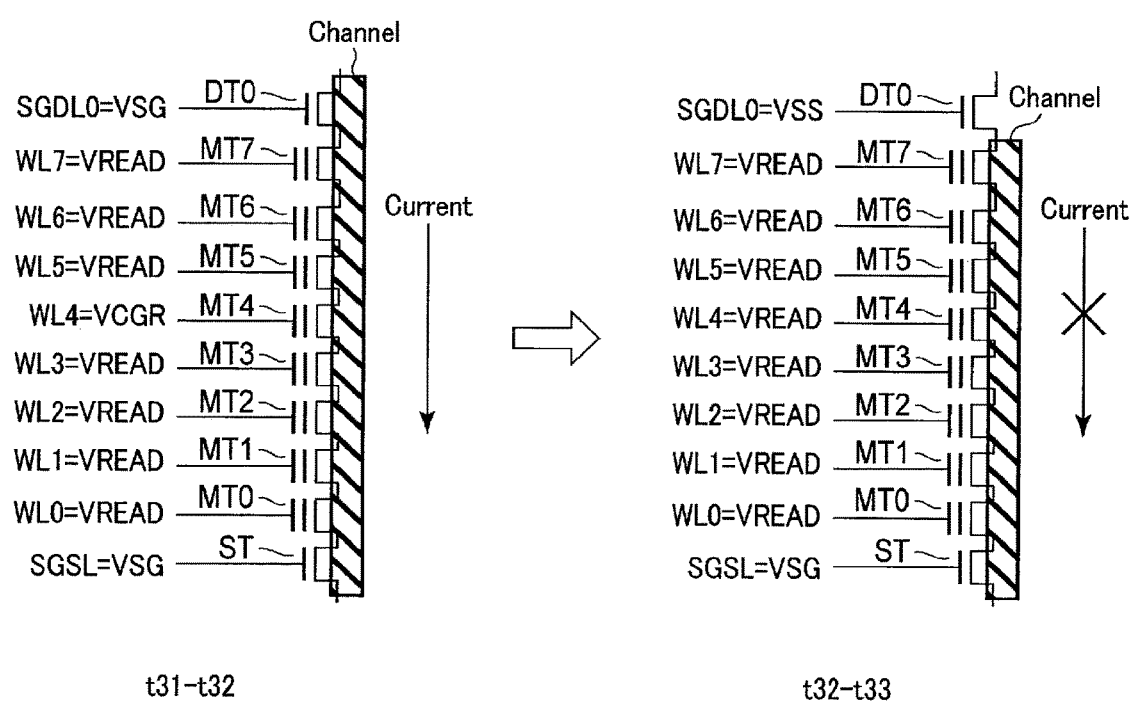
F I G. 37

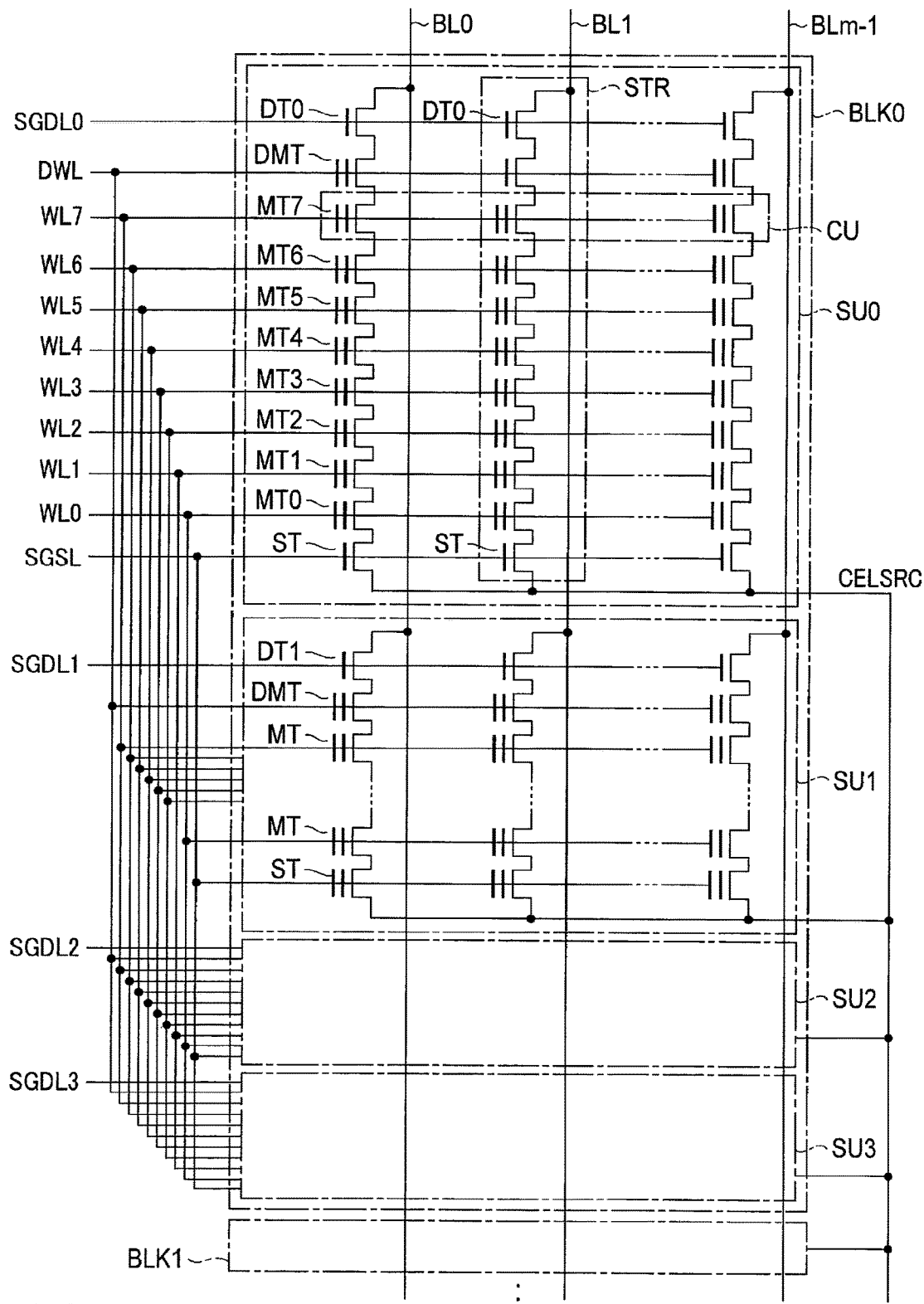
F I G. 39

MEMORY DEVICE AND MEMORY CONTROLLER

CROSS-REFERENCE TO RELATED APPLICATIONS

This application is based upon and claims the benefit of priority from Japanese Patent Application No. 2017-52671, filed Mar. 17, 2017, the entire contents of which are incorporated herein by reference.

FIELD

Embodiments described herein relate generally to a memory device and a memory controller.

BACKGROUND

Memory devices including memory cells arranged in three dimensions are known.

BRIEF DESCRIPTION OF THE DRAWINGS

FIG. 2 illustrates functional blocks of a memory device of the first embodiment;

FIG. 3 illustrates components and connections of a block, and associated components of the first embodiment;

FIG. 6 illustrates an example of components and connections of a row decoder, a driver, and associated functional blocks of the first embodiment;

FIG. 9 illustrates timing of triggering the WL bias for a second example of the triggering condition in the first embodiment;

FIG. 12 illustrates a first example of signals DQ during the first example of the WL bias in the first embodiment;

FIG. 13 illustrates voltages of some interconnects of the memory device during a single-level read of the first embodiment over time;

FIG. 14 illustrates a second example of the signals DQ during the first example of the WL bias in the first embodiment;

FIG. 15 illustrates an example of voltages in the WL bias in the first embodiment;

FIG. 16 illustrates an example of voltages of some interconnects during access to a cell array;

FIG. 20 illustrates the flow of an operation of the memory device of the second embodiment;

FIG. 21 illustrates some of functional blocks of a memory device of a third embodiment;

FIG. 22 illustrates a relationship between detectors and blocks of the third embodiment;

FIG. 23 illustrates another example of a relationship between the detectors and blocks of the third embodiment;

FIG. 24 illustrates another example of functional blocks of the memory device of the third embodiment;

FIG. 29 illustrates a third example of the structure of the capacitive element of the third embodiment;

FIG. 30 illustrates some of functional blocks of a memory device of a fourth embodiment;

FIG. 31 illustrates a first example of a detector of a fourth embodiment in detail;

FIG. 32 illustrates a second example of the detector of the fourth embodiment in detail;

FIG. 33 illustrates the flow of an operation of the memory device of the fourth embodiment;

FIG. 34 illustrates the flow of an operation of the memory device of a fifth embodiment;

FIG. 35 illustrates an example of an operation performed by a memory device of a sixth embodiment in response to reception of a data read instruction from a memory controller;

FIG. 36 illustrates voltages of some interconnects of the memory device of the sixth embodiment during a data read over time;

FIG. 37 illustrates a state of a part of the memory device of the sixth embodiment during an operation;

FIG. 39 illustrates components and connections of a block, and associated components of a modification of the sixth embodiment;

DETAILED DESCRIPTION

Figure 1:
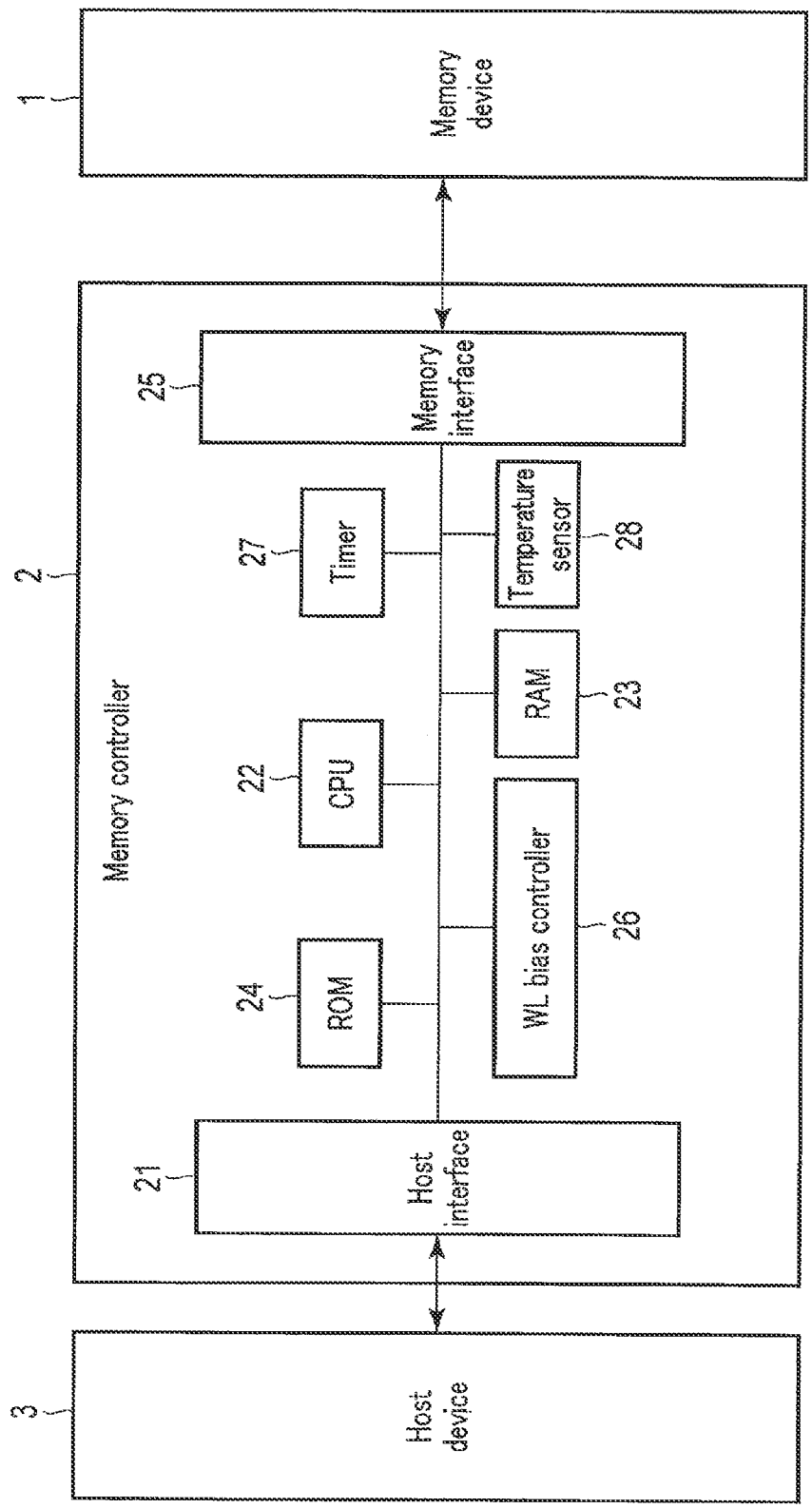
FIG. 1 illustrates functional blocks and associated components of a memory controller of a first embodiment.

In general, according to one embodiment, a memory controller transmits a first instruction to a memory device. The memory device includes cell transistors coupled in series; word lines respectively coupled to respective gates of the cell transistors; a first data latch; and a second latch. The first instruction instructs application of a positive voltage to one of the word lines. The memory controller transmits a second instruction after the transmission of the first instruction and before transmitting a third instruction. The third instruction instructs output of data from the memory device. The second instruction is different from the third instruction and a fourth instruction instructing copy of data from the first data latch to the second data latch.

Embodiments will now be described with reference to the figures. In the following description, components with substantially the same functionalities and configurations will be referred to with the same reference numerals, and repeated descriptions may be omitted. The figures are schematic, and the relations between the thickness and the area of a plane of a layer and ratios of thicknesses of layers may differ from actual ones. The entire description for a particular embodiment also applies to another embodiment unless it is explicitly mentioned otherwise or obviously eliminated.

Each functional block can be implemented as hardware, computer software, or combination of the both. For this reason, in order to clearly illustrate that each block can be any of hardware, computer software or combination, descriptions will be made in terms of their functionalities in general. It is not necessary that functional blocks be distinguished as in the following examples. For example, some of the functions may be implemented by functional blocks different from those illustrated below.

Any step in a flow of a method of an embodiment is not limited to any illustrated order, and can occur in an order different from an illustrated order and/or can occur concurrently with another step.

In the specification and the claims, a phrase of a particular first component being "coupled" to another second component includes the first component being coupled to the second component either directly or via one or more components which are always or selectively conductive.

First Embodiment

<1-1. Structure (Configuration)>

FIG. 1 illustrates components associated with a memory device (semiconductor memory device) 1 of the first embodiment. As illustrated in FIG. 1, the memory device 1 is controlled by a memory controller 2. The memory controller 2 receives commands from a host device 3, and controls the memory device 1 based on the received commands.

The memory controller 2 includes a host interface 21, a central processing unit (CPU) 22, a random access memory (RAM) 23, a read only memory (ROM) 24, a memory interface 25, a WL bias controller 26, a timer 27, and a temperature sensor 28. The memory controller 2 performs various operations, some of the functions of the host interface 21 and the memory interface 25, and some or all of the functions of the WL bias controller 26, when firmware (program) stored in the ROM 24 and loaded onto RAM 23 is executed by the CPU 22. The RAM 23 further temporarily stores data and has functions as a buffer and a cache. The data includes data to be written in the memory device 1, data read from the memory device 1, data received from the host device 3, data to be transmitted to the host device 3, and management data.

The host interface 21 is coupled to the host device 3 via a bus, and manages communications between the memory controller 2 and the host device 3. The memory interface 25 is coupled to the memory device 1, and manages communications between the memory controller 2 and the memory device 1. The WL bias controller 26 controls processes for controlling voltages of word lines WL (not shown), which are included in the memory device 1. The timer 27 can measure an elapsed time from the start with any interval and output the elapsed time. The temperature sensor 28 measures the temperature in the position of the temperature sensor 28, and stores the information indicative of the current temperature (temperature information).

FIG. 2 illustrates functional blocks of the memory device 1 of the first embodiment. As illustrated in FIG. 2, the memory device 1 includes components, such as a memory cell array 10, an input and output circuit 11, an input and output controller 12, a sequencer (controller) 13, a potential generator 14, a driver 15, a sense amplifier 16, a column decoder 17, a data latch set 18, and a row decoder 19.

The cell array 10 includes plural memory blocks BLK (BLK0, BLK1, . . . ). A block BLK is a unit for data erase, and, for example, data in a block BLK is erased together. Data may be erased in a unit smaller than one block BLK, such as half a block BLK.

Each block BLK is a set of plural string units SU (SU0, SU1, . . . ). Each string unit SU is a set of plural NAND strings (strings) STR (STR0, STR1, . . . ), which are not shown. A string STR includes plural memory cell transistors MT.

The input and output circuit 11 and the input and output controller 12 are coupled to the memory controller 2 via a NAND bus. The NAND bus transmits signals ⁻CE, CLE, ALE, ⁻WE, ⁻RE, and ⁻WP, signals DQ (signals DQ0 to DQ7), and data strobe signals DQS and ⁻DQS. The sign "⁻" preceding the name of a signal indicates the inversion logic of the signal with that name without the sign "⁻", and means that the signal with the sign "⁻" is asserted when it is at the low level.

The input and output circuit 11 receives the signals DQ, and transmits the signals DQ. The input and output circuit 11 also receives and transmits the data strobe signals. DQS and ⁻DQS. The input and output controller 12 receives various control signals from the memory controller 2, and controls the input and output circuit 11 based on the control signals. The control signals include the signals ⁻CE, CLE, ALE, ⁻WE, ⁻RE, and ⁻WP, and the data strobe signals DQS and ⁻DQS.

The signals DQ (DQ0 to DQ7) collectively have a width of, for example, eight bits, are the substance of data, and include commands (CMD), write or read data (DAT), address signals (ADD), status data (STA), etc.

An asserted signal ⁻CE enables the memory device 1. An asserted signal CLE notifies the memory device 1 that the signals DQ input into the memory device 1 in parallel to that signal CLE are a command CMD. An asserted signal ALE notifies the memory device 1 that the signals DQ input into the memory device 1 in parallel to that signal ALE is an address signal ADD. An asserted signal ⁻WE instructs the memory device 1 to store the signals DQ input into the memory device 1 in parallel to that signal ⁻WE. An asserted signal ⁻RE instructs the memory device 1 to output the signals DQ. An asserted signal ⁻WP instructs prohibition of data write and erase to the memory device 1. The signal RY/⁻BY indicates whether the memory device 1 is in a ready state or in a busy state, and indicates the busy state with the low level. The memory device 1 accepts commands from the memory controller 2 in the ready state, and does not accept the commands from the memory controller 2 in the busy state.

The signals DQS and ⁻DQS flowing from the memory controller 2 to the memory device 1 instruct when the memory device 1 should output the signals DQ. The signals DQS and ⁻DQS flowing from the memory device 1 to the memory controller 2 notify when the memory controller 2 outputs the signals DQ.

The sequencer 13 receives the commands CMD and address signals ADD from the input and output circuit 11, and controls the potential generator 14, the driver 15, the sense amplifier 16, and the column decoder 17 based on the commands CMD and address signals ADD.

The potential generator 14 receives power potentials from outside the memory device 1, and generates plural potentials (voltages) from the power potentials. The generated potentials are supplied to components, such as the driver 15 and the sense amplifier 16. Application of various potentials applies voltages to various components and interconnects in the memory device 1. The driver 15 receives the potentials generated by the potential generator 14, and supplies selected ones of the received potentials to the row decoder 19.

The row decoder 19 receives various potentials from the driver 15, receives the address signals ADD from the input and output circuit 11, and selects one block BLK based on a received address signal ADD, and transfers the potentials from the driver 15 to the selected block BLK.

The sense amplifier 16 senses the states of the cell transistors MT, generates read data based on the sensed states, and transfers write data to the cell transistors MT.

The data latch set 18 stores write data DAT from the input and output circuit 11, and supplies the write data DAT to the sense amplifier 16. The data latch set 18 also receives read data DAT from the sense amplifier 16, and supplies the read data DAT to the input and output circuit 11 in accordance with the control of the column decoder 17. The column decoder 17 controls the data latch set 18 based on the address signals ADD.

<1-1-1. Block>

FIG. 3 illustrates an example of some components and connections of the cell array 10, and illustrates components and connections of one block BLK0 and associated components. Plural (for example, all) blocks BLK all include the components and connections illustrated in FIG. 3.

One block BLK includes string units SU0 to SU3. One block BLK may also include only one string unit SU.

Each of m (m being a natural number) bit lines BL0 to BLm−1 is coupled to strings STR respectively from the string units SU0 to SU3 in each block BLK.

Each string STR includes one select gate transistor ST, plural (for example, eight) memory cell transistors MT, and one select gate transistor DT (DT0, DT1, DT2, or DT3). The transistors ST, MT, and DT are serially coupled in this order between a source line CELSRC and one bit line BL. A cell transistor MT includes a control gate electrode (word line WL) and a charge storage layer insulated from the environment, and can store data in a non-volatile manner based on the quantity of the electric charge in the charge storage layer.

Strings STR respectively coupled to different bit lines BL make one string unit SU. In each string unit SU, the control gate electrodes (gates) of the cell transistors MT0 to MT7 are coupled to the word lines WL0 to WL7, respectively. Furthermore, in each block BLK, word lines WL with the same address in the different string units SU are also coupled to each other. A set of cell transistors MT which share one word line WL in one string unit SU is referred to as a cell unit CU.

The transistors DT0 to DT3 belong to the string units SU0 to SU3, respectively. For each case of α=0, 1, 2, and 3, the gate of each transistor DTα of each of strings STR of a string unit SUα is coupled to a select gate line SGDLα. The gates of the transistors ST are coupled to a select gate line SGSL.

Figure 4:
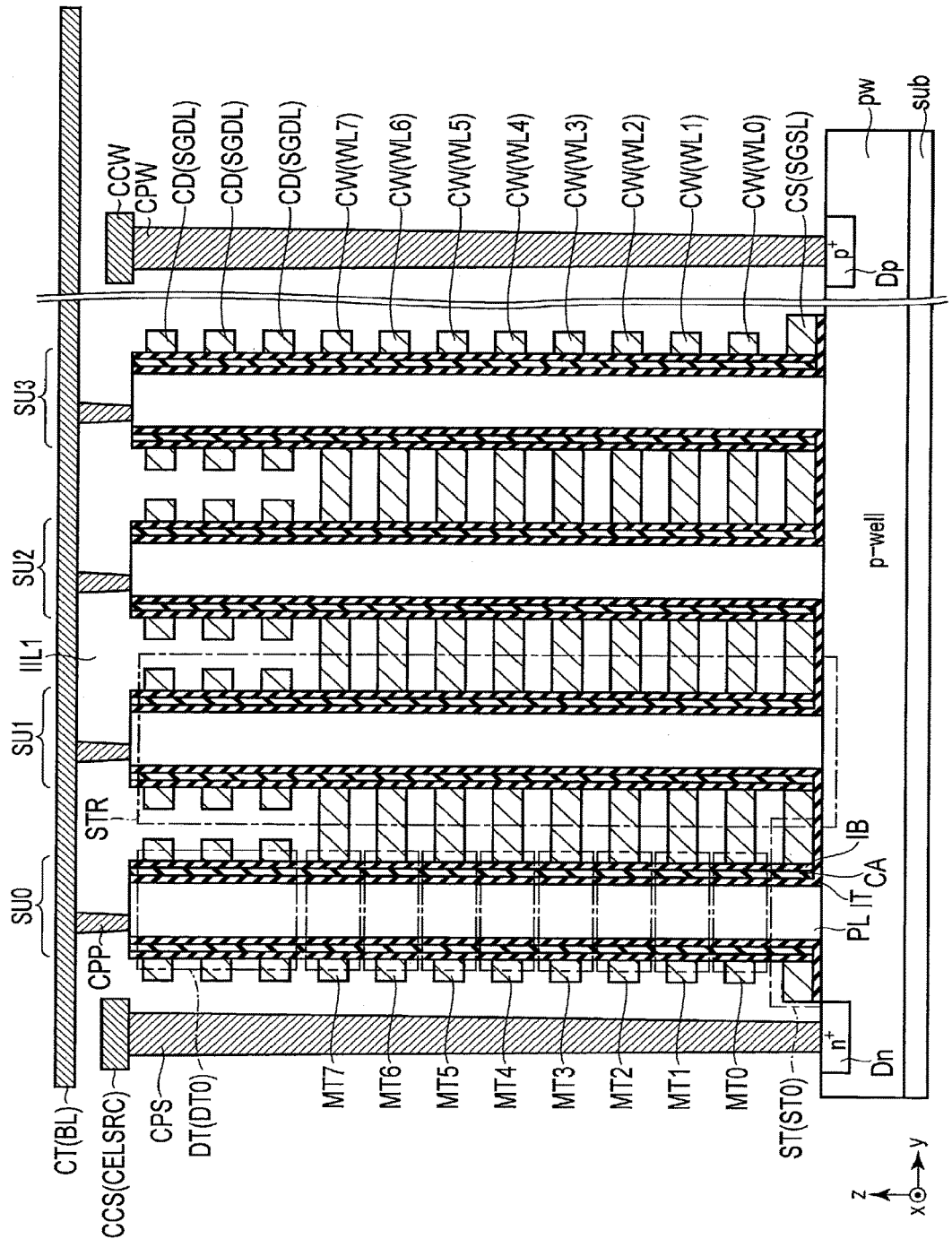
FIG. 4 illustrates an example of the structure of the block of the first embodiment.

Each block BLK has the structure illustrated in FIG. 4, for example. As illustrated in FIG. 4, string units SU are provided on a substrate sub. The substrate sub extends along the xy-plane and includes a p-type well pw in its surface area. Each string unit SU includes strings STR lined up along the x-axis. Each string STR includes a semiconductor pillar PL. Each pillar PL extends along the z-axis, is in contact with the well pw at its bottom, and serves as channel regions in which channels of the transistors MT, DT, and ST are formed and a body. The top of the pillar PL is coupled to a conductor CT via a conductive plug CPP. The conductor CT extends along the y-axis, serves as one bit line BL, and has an interval with another conductor CT located at another coordinate on the x-axis. The side of the pillar PL is covered with a tunnel insulator (layer) IT. The tunnel insulator IT is also located on the well pw. The side of the tunnel insulator IT is covered with a charge storage layer CA. The charge storage layer CA is insulative or conductive, and has its side covered with a block insulator (layer) IB.

In each string unit SU, a conductor CS, plural (for example, eight) conductors CW, and plural (for example, three) conductors CD are provided above the well pw. Plural conductors CS may also be provided. The conductors CS, CW, and CD are lined up along the z-axis at intervals in this order, extend along the x-axis, and are in contact with the block insulator IB. The conductor CS also sandwiches the tunnel insulator IT with the surface of the well pw. The conductors CS, CW, and CD serve as a select gate line SGSL, word lines WL0 to WL7, and a select gate line SGDL, respectively. In each string unit SU, the conductors CS, CW, and CD are at their insides in contact with the respective block insulators IB on the sides of all pillars PL in that string unit SU.

Sets of sections of a pillar PL, a tunnel insulator IT, a charge storage layer CA, and a block insulator IB at crossings with the conductors CS, CW, or CD serve as a select gate transistor ST, a cell transistor MT, or a select gate transistor DT, respectively. The transistors ST, MT, and DT which share a pillar PL and are lined up along the z-axis make one string STR.

A diffusion layer of $p^+$-type impurities Dp is provided in an area in the surface of the well pw. The diffusion layer Dp is coupled to a conductor CCW via a conductive plug CPW. The plug CPW extends along the xz-plane.

In an area in the surface of the well pw, a diffusion layer of $n^+$-type impurities Dn is further provided. The diffusion layer Dn is coupled to a conductor CCS via a conductive plug CPS. The conductor CCS serves as the source line CELSRC.

An area above substrate sub and free from the conductors CS, CW, CD, CCS, and CCW, and the plugs CPS and CPW are provided with an insulator IIL1.

<1-1-2. Cell Transistors>

Figure 5:
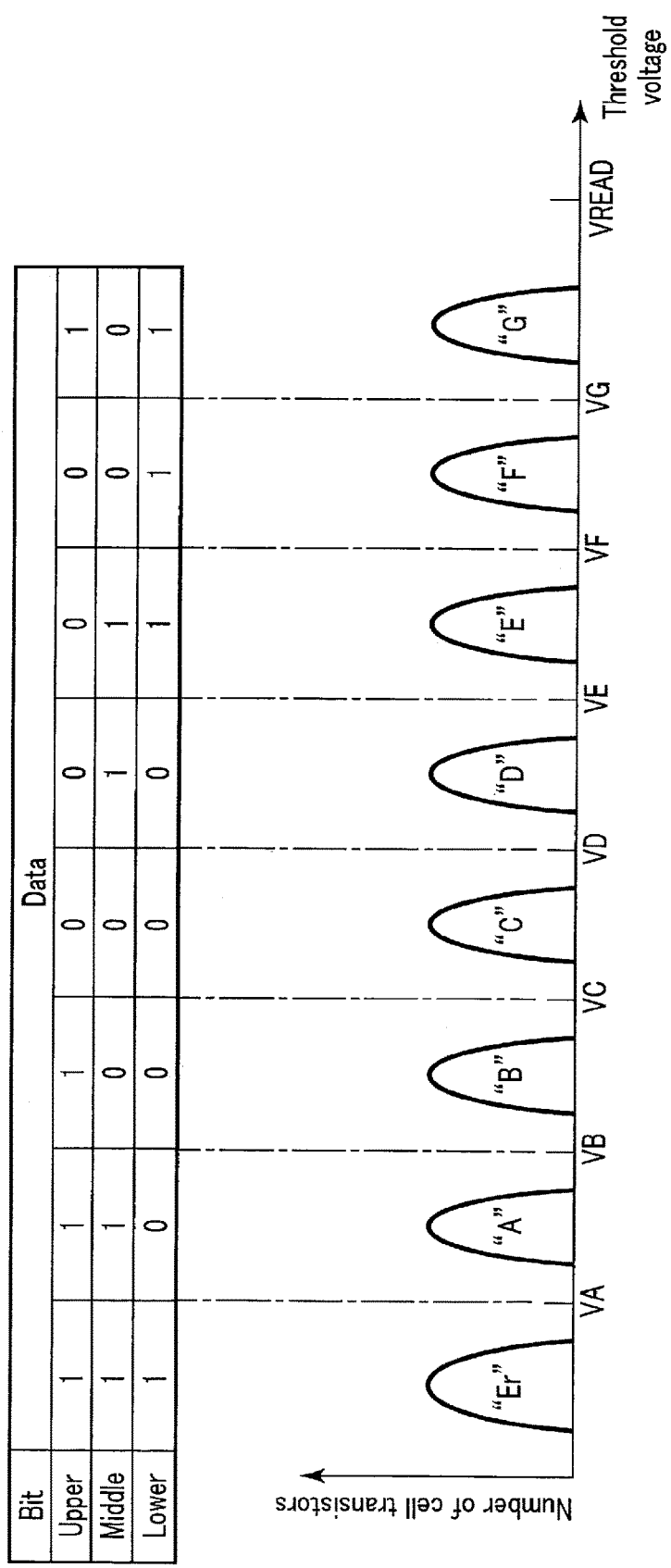
FIG. 5 illustrates an example of distributions of threshold voltages of cell transistors of the first embodiment.

Referring to FIG. 5, the cell transistors MT are described. The memory device 1 can store data of two or more bits in one cell transistor MT. FIG. 5 illustrates distributions of threshold voltages of the cell transistors MT each storing three-bit data as a result of a program. The threshold voltage of each cell transistor MT has a magnitude according to stored data. In a case of storing of three-bits per cell transistor MT, each cell transistor MT can have one of eight threshold voltages. The eight threshold voltages are in states storing data 111, data 110, data 100, data 000, data 010, data 011, data 001, and data 101, respectively.

Even cell transistors MT storing the same particular three-bit data may have different threshold voltages due to variations of the cell transistors MT in properties, etc. Therefore, the threshold voltages of the cell transistors MT storing the same data form one distribution. Distributions are referred to as Er, A, B, C, D, E, F, and G-levels.

In order for data in a cell transistor MT to be determined for a read, the level to which the threshold voltage of that cell transistor MT belongs is determined. For determination of a level, read voltages VA, VB, VC, VD, VE, VF, and VG are used. Hereinafter, a voltage of a particular magnitude applied to a read-target cell transistor MT for determining the level, including the voltages VA, VB, and VC, VD, VE, VF, and VG, may be referred to as a read voltage VCGR.

Whether the threshold voltage of a read-target cell transistor MT exceeds a particular read voltage VCGR is used to determine the level to which the threshold voltage of that cell transistor MT belongs. Cell transistors MT with threshold voltages larger than a read voltage VCGR remain off even when they receive the read voltage VCGR in their control gate electrodes. In contrast, cell transistors MT with threshold voltages smaller than a read voltage VCGR remain on while they are receiving the read voltage VCGR in the control gate electrodes. A voltage VREAD is applied to the word lines WL of cell transistors MT of a non-read-target cell unit CU, and is larger than the threshold voltages of cell transistor MT in any level.

The set of data in respective same-positioned bits of the cell transistors MT of one cell unit CU makes one page.

<1-1-3. Row Decoder>

FIG. 6 illustrates an example of components and connections of the row decoder 19, the driver 15 and associated functional blocks of the first embodiment. As illustrated in FIG. 6, the potential generator 14 generates potentials, such as potentials VPGM, VPASS, VCGR, and VREAD, and supplies the same to the driver 15.

The driver 15 includes drivers SGDdrv0 to SGDdrv3, SGSdrv, and CGdrv0 to CGdrv7. The drivers SGDdrv0 to SGDdrv3, SGSdrv, and CGdrv0 to CGdrv7 receive various potentials from the potential generator 14, and supply the received potentials to interconnects SGD0 to SGD3, SGS, and CG0 to CG7, respectively.

For each of β (β being zero or a natural number), the interconnects SGD0 to SGD3, SGS, and CG0 to CG7 are coupled to the select gate lines SGDL0 to SGDL3 and SGSL, and the word lines WL0 to WL7 via respective corresponding transistors XFRβ, respectively. For each β, the transistors XFRβ receive at their gates a signal on a block select line BsLβ from a block decoder 19aβ. The block decoders 19a (19a0, 19a1, . . . ) are included in the row decoder 19, and receive a block address signal. The block address signal is part of the address signal ADD. The block address signal ADD selects one block decoder 19a, and the selected block decoder 19aβ supplies an asserted signal to the transistors XFRβ. This allows the select gate lines SGDL0 to SGDL3 and SGSL, and the word lines WL0 to WL7 of the only selected block BLKβ to receive the potentials from the driver 15.

<1-2. Operations>

Figure 7:
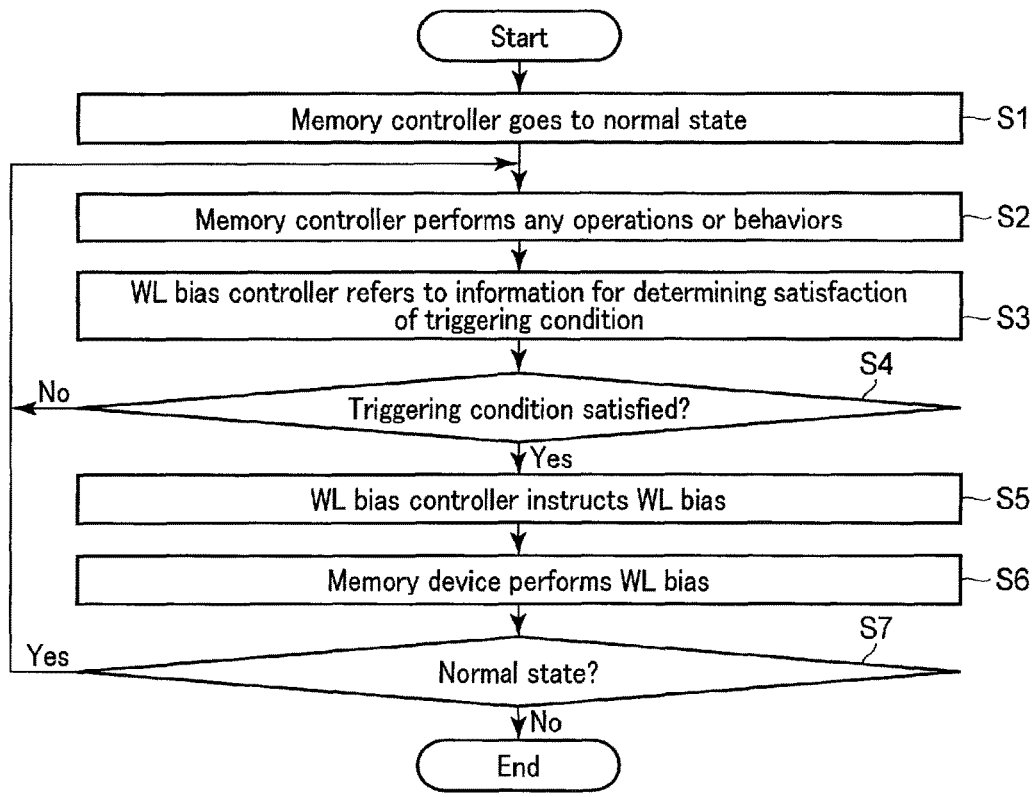
FIG. 7 illustrates the flow of an operation of the memory controller and the memory device of the first embodiment.

FIG. 7 illustrates the flow of an operation of the memory controller and the memory device of the first embodiment. As illustrated in FIG. 7, the memory controller 2 enters a normal state (step S1). The normal state refers to a state of the memory controller 2 in which, for example, the memory controller 2 receives a power supply from outside and can perform some operation, and it may be a state in which the memory controller 2 can access the memory device 1 and/or a state in which the memory device 1 accepts access from the memory controller 2.

As illustrated in FIG. 7, the memory controller 2 performs any operations or behaviors (step S2). Such any operations or behaviors include all operations or behaviors that the memory controller 2 can perform in the normal state, and include any communications with the host device 3 or the memory device 1. The communications with the memory device 1 include transmission of commands or data to the memory device 1, and reception of data from the memory device 1, for example. Any operations or behaviors also include a state in which the memory controller 2 performs no communications with the host device 3 or the memory device 1. Such a state includes a state in which some process is being performed in the memory controller 2, and a state in which the memory controller 2 waits while performing no process.

In step S3, the WL bias controller 26 refers to information for determining whether a condition for triggering WL bias, which is performed in a below-mentioned step S6, is satisfied. The information is, among various information available for the memory controller 2, information selected based on a triggering condition adopted by the WL bias controller 26.

When the triggering condition is not satisfied (No branch of step S4), the flow goes back to step S2. In other words, while the memory controller 2 performs operations or behaviors in the normal state, the WL bias controller 26 performs monitoring and refers to the information as in step S3 during the monitoring.

When the triggering condition is satisfied in step S4 (Yes branch), the WL bias controller 26 instructs WL bias to the memory device 1 (step S5). When the memory device 1 receives the instruction, it performs the WL bias (step S6). The WL bias refers to an operation for applying a positive voltage to a particular one or more word lines WL. The details of the WL bias will be described below. As long as the memory device 1 is in the normal state, the flow goes back to step S2.

Referring to FIGS. 8 to 11, some examples of the triggering condition will now be described.

Figure 8:
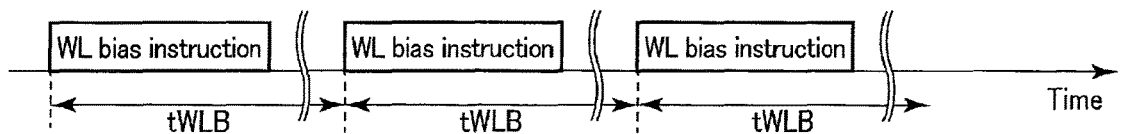
FIG. 8 illustrates timing of triggering a WL bias for a first example of a triggering condition in the first embodiment.

A first example of the triggering condition is a lapse of a particular time. FIG. 8 illustrates timing of triggering the WL bias for the first example of the triggering condition in the first embodiment. As illustrated in FIG. 8, the WL bias controller 26 instructs the WL bias to the memory device 1 whenever a particular time tWLB lapses. Therefore, in the first example of the triggering condition, the WL bias controller 26 refers to a time elapsed from the instruction of the previous WL bias (or, execution of step S6) using the timer 27 in step S3. To this end, the WL bias controller 26 obtains information which includes the elapsed time indicated by the timer 27 from the timer 27 in step S3. Alternatively, the timer 27 may supply the information including the elapsed time to the WL bias controller 26 when a preset time passes. In the first example, the WL bias controller 26 resets the timer 27 whenever step S6 is performed.

For a case of any operations of step S3 including a continued wait state of the memory controller 2, the satisfaction of the triggering condition of step S4 refers to an elapse of a time from a particular time over which the memory controller 2 remains in the wait state.

A second example of the triggering condition is that the number of times of reads or erasures (or, writes) of data in the memory device 1 reaches a reference. FIG. 9 illustrates a timing of triggering the WL bias for the second example of the triggering condition in the first embodiment. The WL bias controller 26 stores a table (count table) as illustrated in FIG. 9 in the RAM 23, or sets of values (data) associated with each other in a manner illustrated in FIG. 9. As illustrated in FIG. 9, the RAM 23 stores the counts of reads and/or those of erasures (or writes) for each block address. Whenever a cell transistor MT in each block BLK is accessed, the WL bias controller 26 increments the corresponding counts of reads and/or erasures (or, writes) for that block BLK by one. Specifically, when data is read from a cell unit CU of a particular block BLKx (x being zero or a natural number), the WL bias controller 26 increments the read count R (R0, R1, . . . ) for the block BLKx by one. Similarly, when data in the block BLKx is erased, the WL bias controller 26 increments the erase count E (E0, E1, . . . ) for the block BLKx by one. Alternatively, the write counts may be counted instead of the erase counts. In this case, when data is written in, for example, a cell unit CU in the block BLKx, the WL bias controller 26 increments the write count for the block BLKx by one. Hereinafter, the erase count or the write count is referred to as an erase/write count.

As illustrated in FIG. 9, the read count for the block BLKx is Rx at a particular time. In this state, data is read from a cell unit CU in the block BLKx. The WL bias controller 26 then increments the read count for the block BLKx to (Rx)+1. A reference Ref1 exceeded by the read count for any block BLK is the triggering condition of the WL bias. The count (Rx)+1 exceeds the reference Ref1. Therefore, the WL bias controller 26 instructs the WL bias to the memory device 1.

In the second example, a read count (or, erase/write count) may be managed for every set of plural blocks BLK (block set). In this case, when data is read from a cell unit CU in the block BLKx, the WL bias controller 26 increments the read count for the block set including the block BLKx by one. Similarly, when data in the block BLKx is erased, the WL bias controller 26 increments the erase/write count for the block set including the block BLKx by one.

Figure 10:
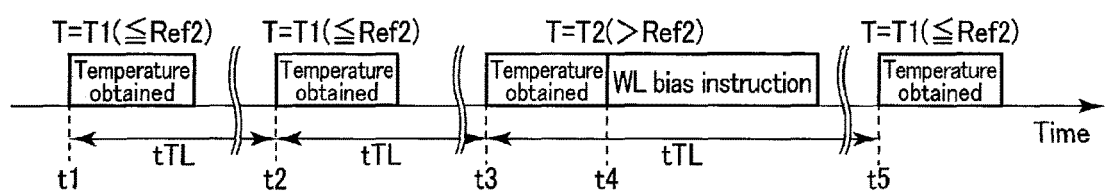
FIG. 10 illustrates timing of triggering the WL bias for a third example of the triggering condition in the first embodiment.

A third example of the triggering condition is a temperature exceeding a reference. FIG. 10 illustrates a timing of triggering the WL bias for the third example of the triggering condition in the first embodiment. As illustrated in FIG. 10, the WL bias controller 26 obtains a temperature whenever a particular time tTL elapses. The temperature is obtained from the temperature sensor 28, and the WL bias controller 26 obtains the temperature information stored by the temperature sensor 28 for every time tTL from the temperature sensor 28, and obtains the current temperature. A reference Ref2 exceeded by the temperature T is the triggering condition of the WL bias. The temperatures obtained at times t1 and t2 are a temperature T1, which is not larger than the reference Ref2, and therefore the WL bias controller 26 does not instruct the WL bias at the times t1 and t2. In contrast, a temperature at a time t3 is T2, which is larger than the reference Ref2. This causes the WL bias controller 26 to instruct the WL bias to the memory device 1 from a time t4.

Figure 11:
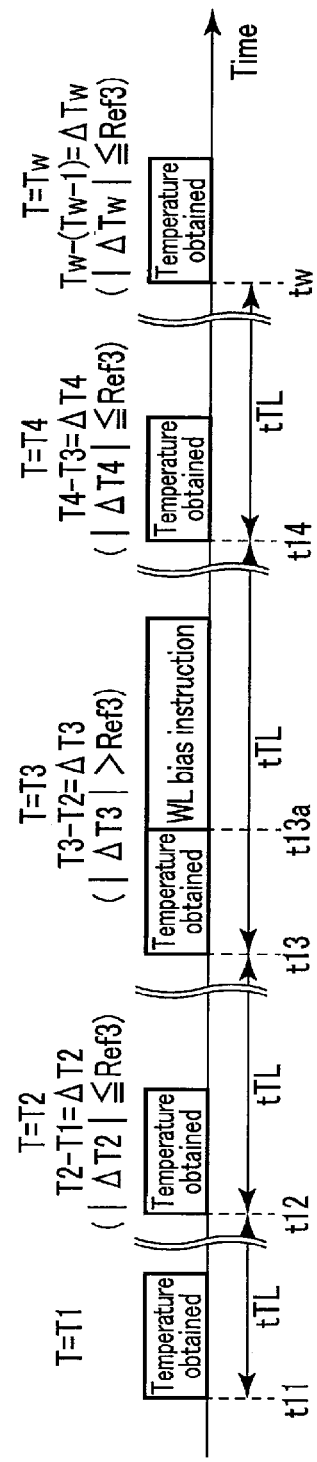
FIG. 11 illustrates timing of triggering the WL bias for a fourth example of the triggering condition in the first embodiment.

A fourth example of the triggering condition is a temperature change exceeding a reference. FIG. 11 illustrates a timing of triggering the WL bias for the fourth example of the triggering condition in the first embodiment. As illustrated in FIG. 11, the WL bias controller 26 obtains a temperature at every lapse of a time tTL as described for the third example of the triggering condition. In the FIG. 11 example, temperatures T1, T2, T3, . . . are obtained at times t11, t12, t13, respectively. Whenever the WL bias controller 26 obtains a temperature, it calculates a difference ΔT between the obtained temperature Tw (w being a natural number) and the temperature Tw−1 obtained last time. The WL bias controller 26 compares the absolute value |ΔT| of each difference ΔT (ΔT2, ΔT3, ΔT4, . . . ) with a reference Ref3. A difference |ΔT| exceeding the reference Ref3 is the triggering condition of the WL bias, and the difference |ΔT3| exceeds the reference Ref3. This causes the WL bias controller 26 to instruct the WL bias to the memory device 1 from a time t13a.

Two or more of the first to fourth examples of the triggering condition may be combined.

Referring to FIGS. 12 to 14, some examples of the WL bias will now be described.

A first example of instructing the WL bias uses a single-level read. FIG. 12 illustrates the first example of the signals DQ in the first example of the WL bias in the first embodiment. The memory controller 2 instructs a single-level read to the memory device 1 as an instruction of the WL bias. The single-level read refers to a data read from a read-target cell transistor MT based on whether that cell transistor MT has a threshold voltage larger than the single read voltage VCGR. The single-level read is contrastive with a multiple level read, which refers to a read of data at any one of bits of a cell transistors MT storing data of two bits or more. Typically, the single-level read is used for the data read from a cell transistor MT in which data has been written to belong to either of two levels. The memory controller 2 uses the single-level read to perform the WL bias no matter how many levels have been used to write data in the cell transistor MT (or, no matter how many bits of data have been written in the cell transistor MT).

As illustrated in FIG. 12, for instructing the single-level read, the memory controller 2 transmits a command XXh, a command ooh, an address signal ADD, and a command 30*h* to the memory device 1 in sequence, for example. The address signal ADD specifies one, plural, or all blocks BLK. The plural blocks BLK are those with sequential addresses, for example. The address signal ADD also specifies any one word line WL. The address signal ADD can further specify any one string unit SU, or any plural string units SU.

For a case where the first example of the WL bias (single-level read used) is combined with the first example of the triggering condition (lapse of constant time) and one single-level read instruction specifies one or more blocks BLK, the memory controller 2 increments the address of a WL-bias target block(s) for every WL-bias instruction. This allows the memory controller 2 to select all blocks as a target for the WL bias eventually.

When the first example of the WL bias is combined with the second example of the triggering condition (read or erase/write count exceeding reference), one single-level read instruction can specify a block BLK whose read (or, erase/write) count exceeds the reference Ref1 or a block set including such a block BLK.

For a case of the first example of WL bias being combined with the third or fourth example of the triggering condition (temperature, or temperature rise or fall exceeding reference), one WL bias instruction can specify all blocks BLK.

When the memory device 1 receives the command 30*h* of the single-level read instruction, the sequencer 13 performs the instructed single-level read to one or more blocks BLK. The memory device 1 outputs the busy signal over a time tR during the single-level read. FIG. 13 illustrates voltages of some interconnects of the memory device 1 during the single-level read of the first embodiment over time. As illustrated in FIG. 13, the sequencer 13 makes the voltage of a bit line BL a voltage VBL from a time t21. The voltage VBL is higher than a voltage VSS.

The sequencer 13 sets the voltage of the source line CELSRC to a voltage VCELSRC from a time t21. The voltage VCELSRC is higher than the voltage VSS, and lower than the voltage VBL.

The sequencer 13 sets the voltages of a select gate line SGDLv (v being a natural number) and SGSL of a selected (specified) string unit SUv to a voltage VSG from the time t21. The voltage VSG has a magnitude to turn on the select gate transistors DT and ST. Select gate lines SGDL of unselected string units SU are maintained at the voltage VSS.

The sequencer 13 sets the voltages of a selected word line WL and unselected word lines WL to the voltage VCGR and the voltage VREAD, respectively.

With the single-level read, data according to the threshold voltages of cell transistors MT coupled to the selected word line WL is read to the data latch set 18 by the sense amplifier 16. While in an ordinary data read, one block BLK, one string unit SU, and one cell unit CU are selected to result in data read from the selected cell unit CU, plural blocks BLK and/or plural string units SU may be selected in the single-level read accompanied by addressing as in the present embodiment. Therefore, the read data does not reflect correctly the data stored in the cell transistors MT.

Referring back to FIG. 12, when the memory controller 2 starts to receive the ready signal after a lapse of a time tR in the ordinary read, it enables the signal ⁻RE the plural number of times as illustrated by the dotted line. Specifically, the data read from the cell transistors MT in response to a data-read instruction by the memory controller 2 travels through a first data latch in the data latch set 18, reaches another data latch for input/output in the data latch set 18, and then is ready to be output there. Then, in response to enabled signal ⁻RE, the data in the input/output data latch is output from the memory device 1 in units of its section (Data), and reaches the memory controller 2, as illustrated by the waveform of the dotted line. In contrast, in the single-level read for the WL bias the memory controller 2 does not enable the signal ⁻RE. Therefore, data is not output from the memory device 1. Instead, any type of the subsequent command ZZh can be transmitted to the memory device 1 from the memory controller 2.

The data which has reached the input/output data latch by the single-level read for the WL bias does not need to be output from the memory device 1, which allows the command ZZ to be a read command. In contrast, unlike the first embodiment, the instruction for data read is generally followed by the enabled signal ⁻RE and accompanying data output from the memory device 1. This is because if a data-read instruction is followed by another data-read instruction without the enabled signal ⁻RE and accompanying data output from the memory device 1, the data in the input/output data latch is overwritten and lost by the second data-read. Therefore, in a read not for the WL bias, a read instruction for obtaining the data from the memory device 1 is generally followed by the signal ⁻RE, and not by an instruction for access to the cell array 10 except for a cache read. The cache read instructs copying of the data in the first data latch to the input/output data latch, and reading data to the first data latch from the cell array 10. In contrast, the memory device 1 can receive an instruction of single-level read, and any subsequent instruction. Similarly, the memory controller 2 can transmit the instruction of the single-level read, and any subsequent instruction to the memory device 1.

A multiple level read instruction may be used for the WL bias instruction. Specifically, an instruction of a read from one of the pages of a cell unit CU including cell transistors MT which store data of two bits or more per cell transistor MT may be used.

The single-level read of the first example of the WL bias may be instructed by a dedicated command. FIG. 14 illustrates a second example of the signals DQ in the first example of the WL bias in the first embodiment. As illustrated in FIG. 14, the memory controller 2 transmits a command Z1h, an address signal ADD, and a command 1Zh to the memory device 1 as the WL bias instruction. The description made with reference to FIG. 12 is applicable to the address signal ADD. When the memory device 1 receives the command 1Zh, the sequencer 13 performs to the specified block BLK the single-level read as described with reference to FIG. 13. The memory device 1 outputs the busy signal over a time tWLB in the single-level read.

A second example of the WL bias includes mere application of voltages to the word line WL. The second example of the WL bias can be instructed by a dedicated command of FIG. 14. When the memory device 1 receives the command 1Zh, the sequencer 13 applies a bias voltage VWLB to one, plural, or all word lines WL of the specified block BLK. The voltage VWLB can be any one of various voltages applied to the word lines WL in another operation of the memory device 1. Specifically, the memory controller 2 applies a voltage VPASS to one, plural, or all word lines WL in the WL bias. The voltage VPASS is used in a data write in the memory device 1, is applied to the unselected word lines WL, is higher than the voltage VSS, and is lower than a voltage VPGM. The voltage VPGM is a voltage applied to the selected word line WL. A reason for the voltage VWLB being lower than voltage VPGM is to avoid unintentional data writes, or unintentional rise of the threshold voltages of the cell transistors MT, by the application of the voltage VPGM. During the application of the voltages to the word lines WL triggered by the dedicated command, other interconnects (for example, the select gate lines SGDL and SGSL) can receive any voltages.

Alternatively, when the sequencer 13 receives the command 1Zh, it applies a voltage VCU to one, plural, or all word lines WL of the specified block BLK. The voltage VCU has a magnitude described in the following. As illustrated in FIG. 15, in a data read (or write), the voltage of a word line WL is brought back to the voltage VSS from the voltage VREAD (or VPASS or VGPM), and thereafter it may not remain at the voltage VSS and may unintentionally rise as illustrated by the dotted line. A voltage the same as or similar to such a risen voltage of the word line WL is the voltage VCU. The voltage VCU is based on dimensions of various components (interconnects, conductors, semiconductors, etc.) of the memory device 1, and voltages applied to the interconnects.

<1-3. Advantages>

The first embodiment can improve the reliability of data reads from the memory device 1. The details are as follows.

In memory devices of a three-dimensional structure, such as the memory device 1 of the first embodiment, the channel regions of the cell transistors MT are not directly coupled to the substrate, in contrast with the memory device of a two-dimensional structure. Instead, the channel regions are coupled to a bit line BL and the substrate sub via the select gate transistors DT and ST, respectively. This inhibits free movement of the charge carriers from the channel regions to the substrate sub, unlike in the two-dimensional structure, and it allows the charge carriers to move to the bit line BL and/or the substrate sub only via the select gate transistors DT and/or ST. Because of this, unless the select gate transistors DT and/or ST are ON, the charge carriers in the channel regions stay therein.

Such remaining charge carriers may keep the channel regions from maintaining an intended voltage, as illustrated in FIG. 16. FIG. 16 illustrates an example of the voltages of some interconnects during access to a cell array, and illustrates an example for a case without the first embodiment applied to the memory device 1. As illustrated in FIG. 16, at a time t200, application of voltages to the interconnects for access to the cell array 10 results in a large potential difference between a word line WL and a channel region which faces that word line WL. If in this state the voltage of the word line WL is made back to the voltage VSS at the time t200, coupling between the word line WL and the channel region lowers the voltage of the channel region to a negative value. If the charge carriers in the channel region could move to the substrate as would be in the two-dimensional structure, the voltage of the channel region can be maintained at the voltage VSS. In the three-dimensional structure, however, the charge carriers in the channel region have restricted movability as described above, and stay in the channel region, which maintain the negative voltage. When the remaining charge carriers in the channel region move to the substrate sub and/or a bit line BL by leak current, the voltage of the channel region falls back to the voltage VSS. As a result, the voltage of the word line WL capacitively coupled to the channel region rises due to the risen voltage of the channel region to become higher than the voltage VSS unintentionally. Such a risen voltage of the word line WL due to the coupling with the channel region gradually falls due to leak current.

Figure 17:
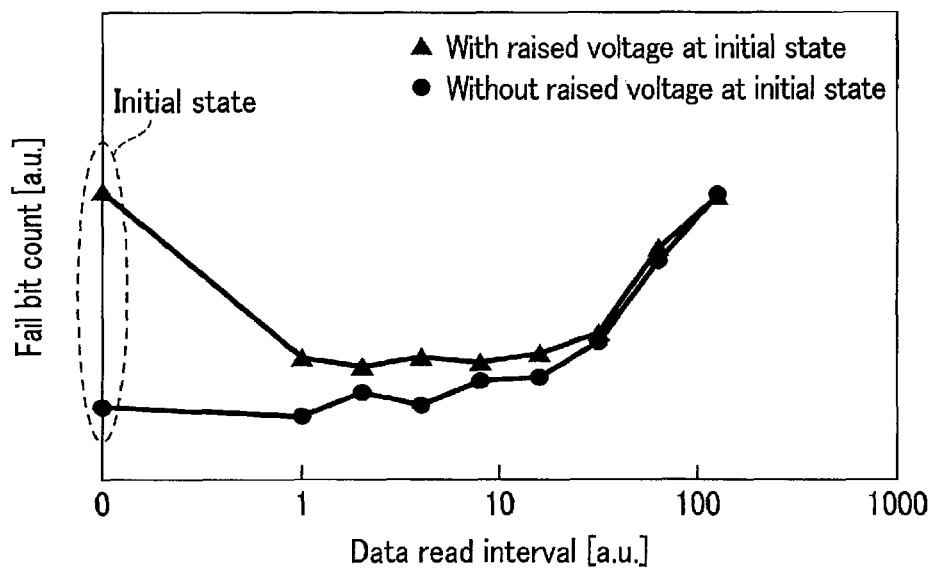
FIG. 17 illustrates a relationship between a data-read interval and the count of fail bits.

Such an unintentional rise of the voltage of the word line WL due to the coupling with the channel region (to be referred to as a coupling rise hereinafter) and the following fall influences the threshold voltages of the cell transistors MT coupled to that word line WL. Specifically, voltages applied to various interconnects during a data read are optimized for either of a state with the voltage of the word line WL with the coupling rise, or that without the coupling rise. For this reason, the voltages of interconnects during the data read may disable correct data to be read from the cell transistors MT as illustrated in FIG. 17. The horizontal axis indicates the interval from a particular data read to the following data read on a log scale. As illustrated in FIG. 17, since the voltages applied to the interconnects are conformed with a case without the coupling rise of the voltage of the word line WL, the count of fail bits (the count of error bits in the read data of a particular size) is high for a case of the voltage with the coupling rise at the initial state. In contrast, the fail bit count is low for a case of the voltage without the coupling rise at the initial state. However, with a long interval to the next read, the voltage of the initially coupling-risen word line WL falls, and the fail bit count accordingly increases.

Such a problem can be solved in theory by canceling the coupling rise of the voltage of the word line WL. However, the influence by the coupling rise of the voltage of the word line WL is not uniform among levels to which the cell transistor MT belongs. A cell transistor MT at a lower level may be incorrectly determined to have a higher threshold voltage, whereas a cell transistor MT at a higher level may be incorrectly determined to have a lower threshold voltage. This makes it impossible to adjust the voltage of the word line WL only to cancel the coupling rise to address the coupling rise of the voltage of word line WL.

The memory controller 2 of the first embodiment biases the voltage of a word line WL during a time of no data-read. A biased word line WL has a voltage higher than the voltage VSS as in the state with a voltage risen by the coupling rise. This allows a read of data from the cell unit CU of the word line WL to be performed in a state similar to the state with the coupling-risen voltage of the word line WL. This can suppress an incorrect read from the cell unit CU.

Figure 18:
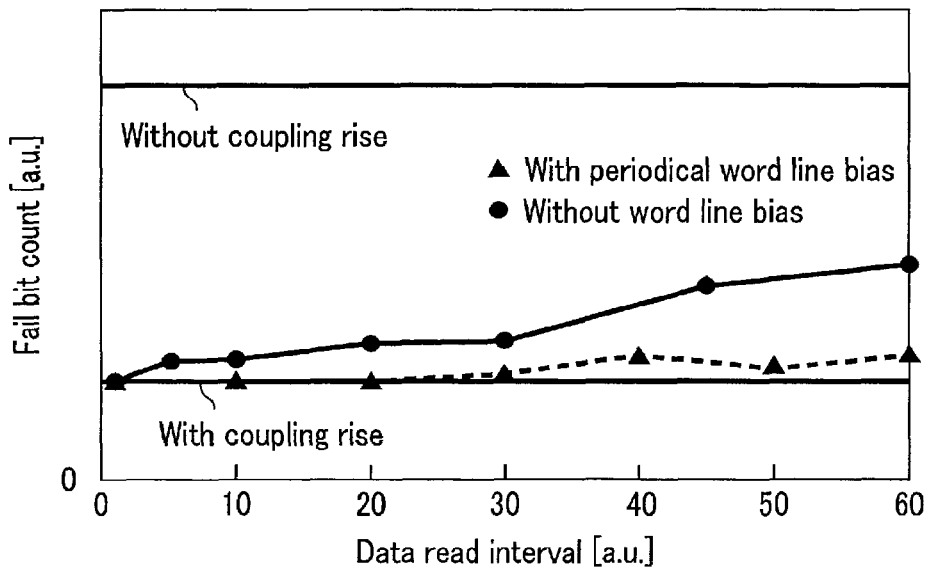
FIG. 18 illustrates another form of a relationship between the data-read interval and the count of fail bits.

In particular, a periodical WL bias as in the first example of the triggering condition allows data reads to be usually performed with the word lines WL biased. This can suppress the fail bit count, as illustrated in FIG. 18. The horizontal axis indicates the interval from a particular data-read to the following data-read. As seen from FIG. 18 and described with reference to FIG. 17, without the WL bias, a longer interval from a particular data-read to the following data-read results in a larger fail bit count. In contrast, the periodical WL bias as in the first example of the triggering condition maintains the word line WL in a state similar to that with the coupling rise. This suppresses the fail bit count even for a long data-read interval, and the fail bit counts are close to those for a case with the voltage of the word line WL with a fixed coupling-rise.

The interval for the WL bias performed can be shorter than a data-read interval from the first data-read to the following data-read after which the fail bit count without initial coupling rise of the voltage of the word line WL as in FIG. 17 starts to greatly increase, for example. Based on this, the interval of the WL bias can be 10 [a.u.], for example. The result with the periodical WL bias in FIG. 18 is based on an example of 10 [a.u.] interval of the WL bias.

Moreover, a leak current generally depends on the temperature, and the characteristics of the leak current may influence the way the voltage of a word line WL falls, which may in turn influence the accuracy of data reads. For this reason, a temperature out of an average temperature range in which the memory device 1 is used greatly influences the leak current, and by extension the accuracy of the data reads. In light of this, the WL bias is performed when the memory device 1 is at a temperature out of the average temperature range as in the third example of the triggering condition. This can improve the accuracy of the data reads from the memory device 1 when it is out of the average temperature range.

Similarly, when the temperature greatly changes, the way the leak current behaves may greatly vary before and after the temperature change. In light of this, the WL bias is performed when the temperature change of the memory device 1 exceeds a particular reference as in the fourth example of the triggering condition. This can improve the accuracy of the data reads from the memory device 1 after a great change of the temperature.

Second Embodiment

The second embodiment differs from the first embodiment in the component which includes the WL bias controller 26.

Figure 19:
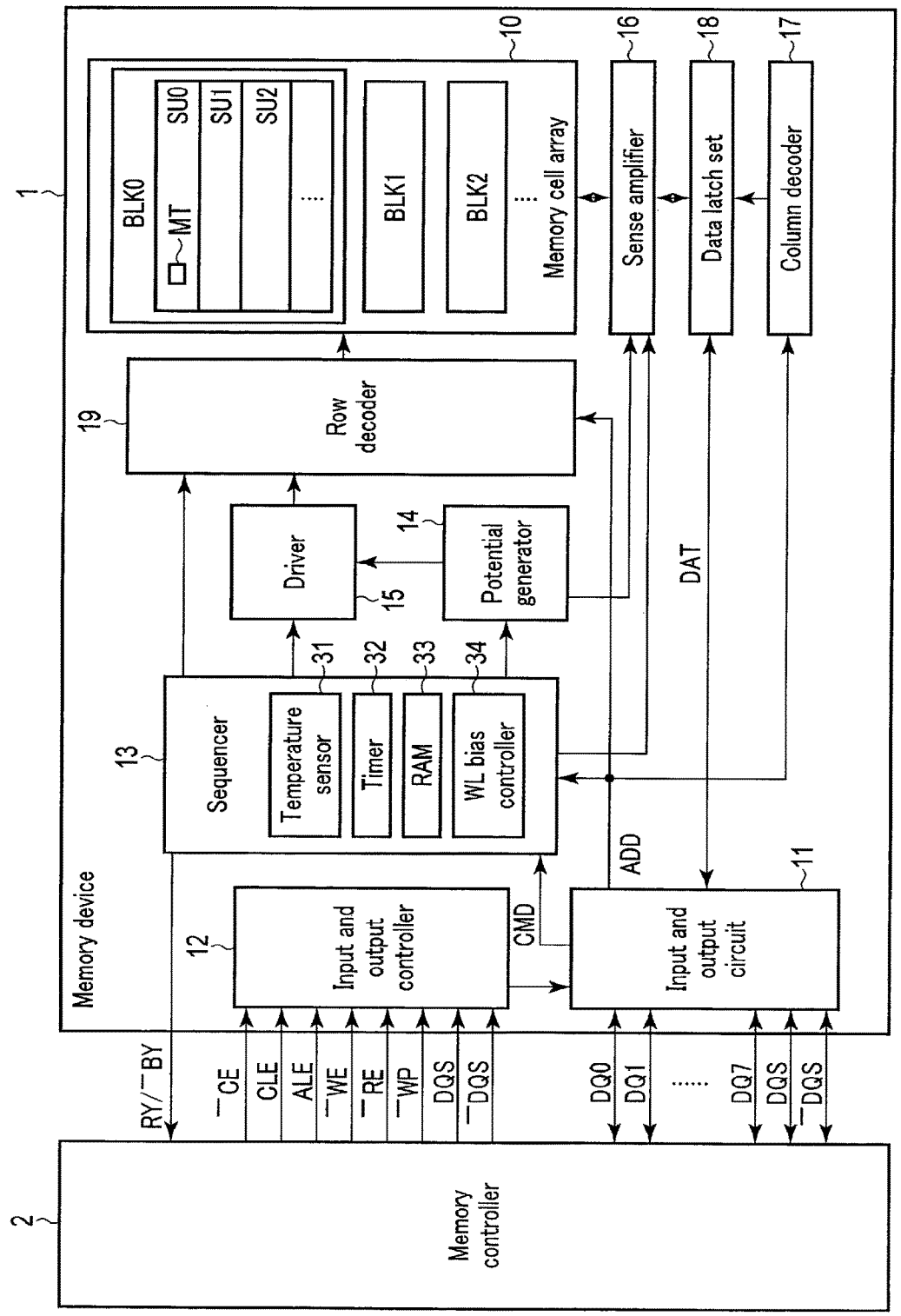
FIG. 19 illustrates functional blocks of a memory device of a second embodiment.

FIG. 19 illustrates functional blocks of a memory device of the second embodiment. In the second embodiment, the memory controller 2 can have the same functional blocks as those of the first embodiment. Alternatively, the memory controller 2 may not include one or more or all of the WL bias controller 26, the timer 27, and the temperature sensor 28.

As illustrated in FIG. 19, the sequencer 13 includes a temperature sensor 31, a timer 32, a RAM 33, and a WL bias controller 34. The temperature sensor 31 and the timer 32 have the same functions as those of the temperature sensor 28 and the timer 27 in the memory controller 2, respectively. The RAM 33 stores information regarding the WL bias (for example, the count table illustrated in FIG. 9) among the functions assumed by the RAM 23 in the memory controller 2.

The WL bias controller 34 has functions similar to the WL bias controller 26 in the memory controller 2, and has the same functions as the WL bias controller 26 except for the difference based on being located in the memory device 1. Specifically, the WL bias controller 34 checks the WL-bias triggering condition without relying on instructions from the memory controller 2, and upon the triggering condition being satisfied it controls components, such as the potential generator 14, the driver 15, and row decoder 19, to perform the WL bias as described in the first embodiment.

FIG. 20 illustrates the flow of an operation of the memory device of the second embodiment. The FIG. 20 flow occurs while the memory device 1 is not performing a process which is based on an instruction (command) received from the memory controller 2.

As illustrated in FIG. 20, the memory device 1 starts to receive supply of power, for example from the memory controller 2 (step S11). The memory device 1 performs a power-on read (step S12). The power-on read includes reading values for parameters for operations of the memory device 1 from the cell array 10, and setting the read values to registers (not shown) in the sequencer 13. After the power-on read, the memory device 1 accepts instructions (commands) from the memory controller 2.

The memory device 1 performs any operations or behaviors (step S13). Such any operations or behaviors include, for example, execution of a process based on an instruction from the memory controller 2 and standby as described with reference to FIG. 7 in the first embodiment. In step S14, the WL bias controller 34 refers to information for determining whether the WL-bias triggering condition to be performed in the below-mentioned step S16 is satisfied. The information is that selected among various information available by the WL bias controller 34 based on the triggering condition adopted by the WL bias controller 34, and is the same as that in the first embodiment.

The WL bias controller 34 determines whether the triggering condition is satisfied (step S15). When the triggering condition is not satisfied (No branch of step S15), the flow goes back to step S13. When the triggering condition is satisfied in step S15, the WL bias controller 34 performs the WL bias (step S16). The description of the first embodiment is applicable to the details of the WL bias.

According to the second embodiment, the memory device 1 performs the WL bias as in the first embodiment. This can produce the same advantages as the first embodiment.

Third Embodiment

The third embodiment relates to a method of determining the WL-bias triggering condition, and details of the second embodiment.

<3-1. Structure (Configuration)>

FIG. 21 illustrates some of functional blocks of the memory device 1 of the third embodiment. The memory device 1 of the third embodiment includes the same functional blocks as the memory device 1 of the second embodiment, and further includes functional blocks illustrated in FIG. 21.

As illustrated in FIG. 21, the WL bias controller 34 includes plural detectors 41 (41_0, 41_1, . . . ) and a bias control circuit 42. Each detector 41 is provided for one block BLK, or a set of blocks BLK, as illustrated in FIG. 22 or 23, respectively.

Referring back to FIG. 21, the detectors 41 all have the same components and connections. Each detector 41 includes a detection circuit 411 and a capacitive element 412. Each detector 41 is coupled at a node 1N (1N0, 1N1, . . . ) to a node to which a voltage is applied from when, during access (operations including data read, data write, or data erase) to the cell array 10, voltages based on the details of the access (for example, voltage VREAD or VCGR) start to be applied to the word line WL to when that voltage application to the word line WL is stopped (for example, brought back to the voltage VSS). Specifically, the node 1N is coupled to the block select line BSL (BLS0, BLS1, . . . ) for one block BLK for which that node 1N is provided. Alternatively, each node 1N is coupled to the block select line BSLy (y being a natural number) for any one of blocks BLK for which that node 1N is provided. The detectors 410, 411, output detection signals DS0, DS1, . . . , respectively.

The bias control circuit 42 receives the detection signals DS (DS0, DS1, . . . ) from respective detectors 41, controls the components, such as the potential generator 14, the driver 15, and row decoder 19, and performs the WL bias.

The capacitive element 412 of each detector 41 may also be provided in the cell array 10, as illustrated in FIG. 24.

Figure 25:
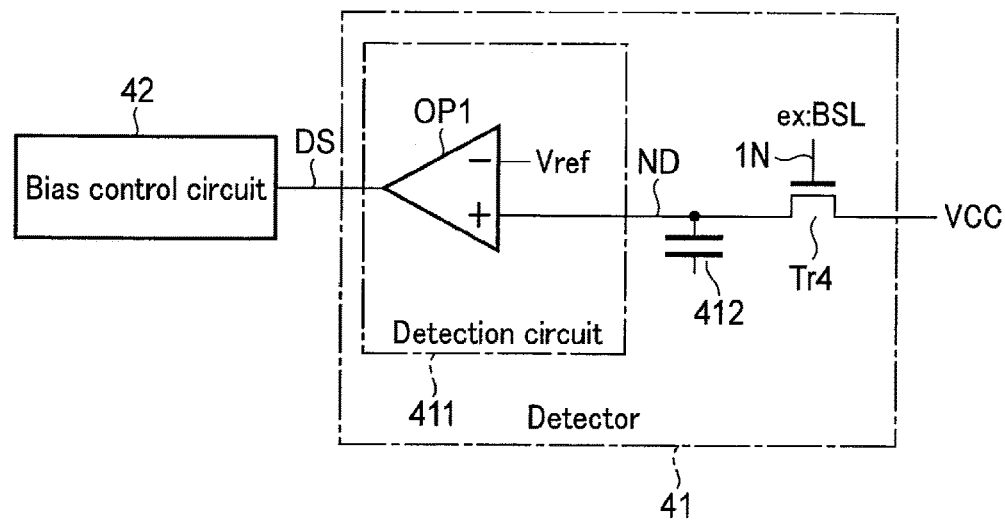
FIG. 25 illustrates a first example of a detection circuit of the third embodiment in detail.

FIG. 25 illustrates a first example of details of one detector 41 of the third embodiment. As illustrated in FIG. 25, the detection circuit 411 includes an operational amplifier OP1, and the detector 41 includes an n-type metal oxide semiconductor field effect transistor (MOSFET) Tr4. The operational amplifier OP1 receives a reference voltage Vref (reference) at its inverting input, and outputs a signal DS. The operational amplifier OP is also coupled to a node ND at its non-inverting input, and the node ND is coupled to the capacitive element 412 and a first end of the transistor Tr4. The transistor Tr4 is coupled to a node of a voltage VCC at its second end. The voltage VCC is an internal power source voltage of the memory device 1. The gate of the transistor Tr4 is the node 1N.

Figure 26:
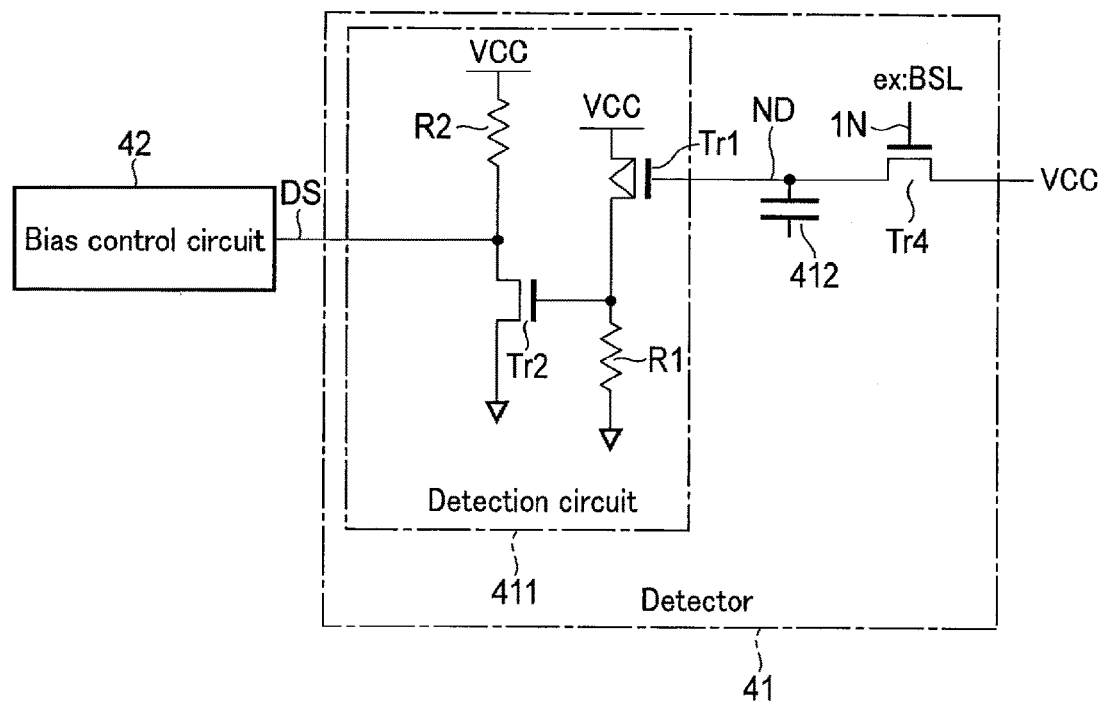
FIG. 26 illustrates a second example of the detection circuit of the third embodiment.

FIG. 26 illustrates a second example of details of one detector 41 of the third embodiment. As illustrated in FIG. 26, the detection circuit 411 includes a p-type MOSFET Tr1, an n-type MOSFET Tr2, and resistors R1 and R2, and the detector 41 includes a transistor Tr4. A first end (one end) of the transistor Tr1 is coupled to the node of the voltage VCC, and a second end (the other end) of the transistor Tr1 is grounded via the resistor R1. The transistor Tr1 is coupled at its gate to the node ND, which is coupled to the capacitive element 412 and a first end of the transistor Tr4. The transistor Tr4 is coupled at its second end to the node of the voltage VCC. The gate of the transistor Tr4 is the node 1N.

The resistor R2 is coupled at its first end to the node of the voltage VCC, and at its second end to a first end of transistor Tr2. The transistor Tr2 is grounded at its second end, and coupled at its gate to the node at which the transistor Tr1 and the resistor R1 are coupled. The second end of the transistor Tr2 serves as a node of the signal DS.

Figure 27:
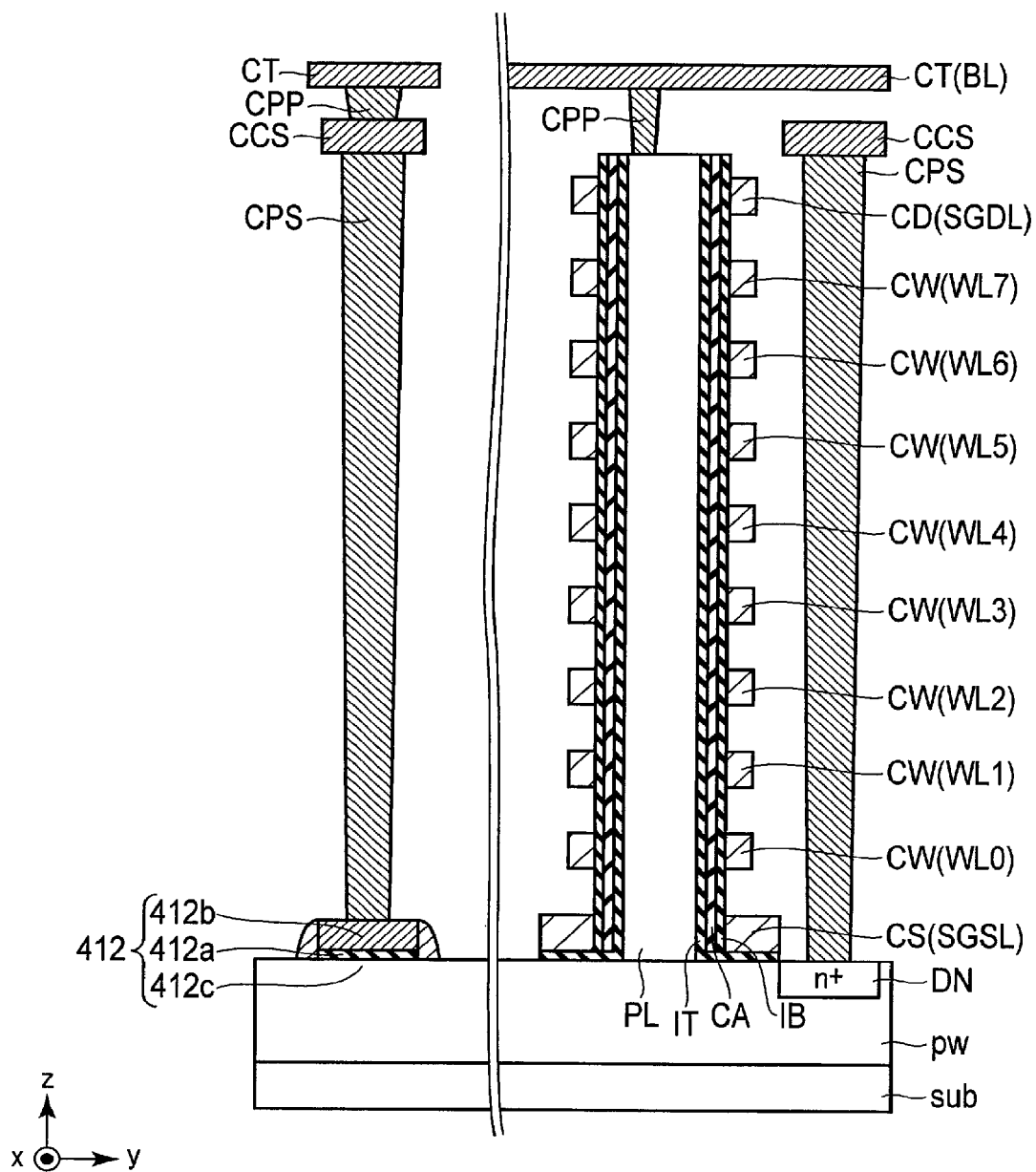
FIG. 27 illustrates a first example of the structure of a capacitive element of the third embodiment.

FIG. 27 illustrates a first example of the structure of the capacitive element 412 of the third embodiment, illustrates a cross-section along the yz-plane of the memory device 1, and includes part of FIG. 4. As illustrated in FIG. 27, the capacitive element 412 includes an insulator 412a on the substrate sub, a conductor 412b on the insulator 412a, and a section 412c of the substrate sub under the insulator 412a. The capacitive element 412 uses the section 412c as one electrode and the conductor 412b as the other electrode to accumulate electric charge. The conductor 412b is coupled at its top to the node ND (see, FIG. 25 or 26) via components, such as a plug CPS, a conductor CCS, a plug CPP, and a conductor CT.

Figure 28:
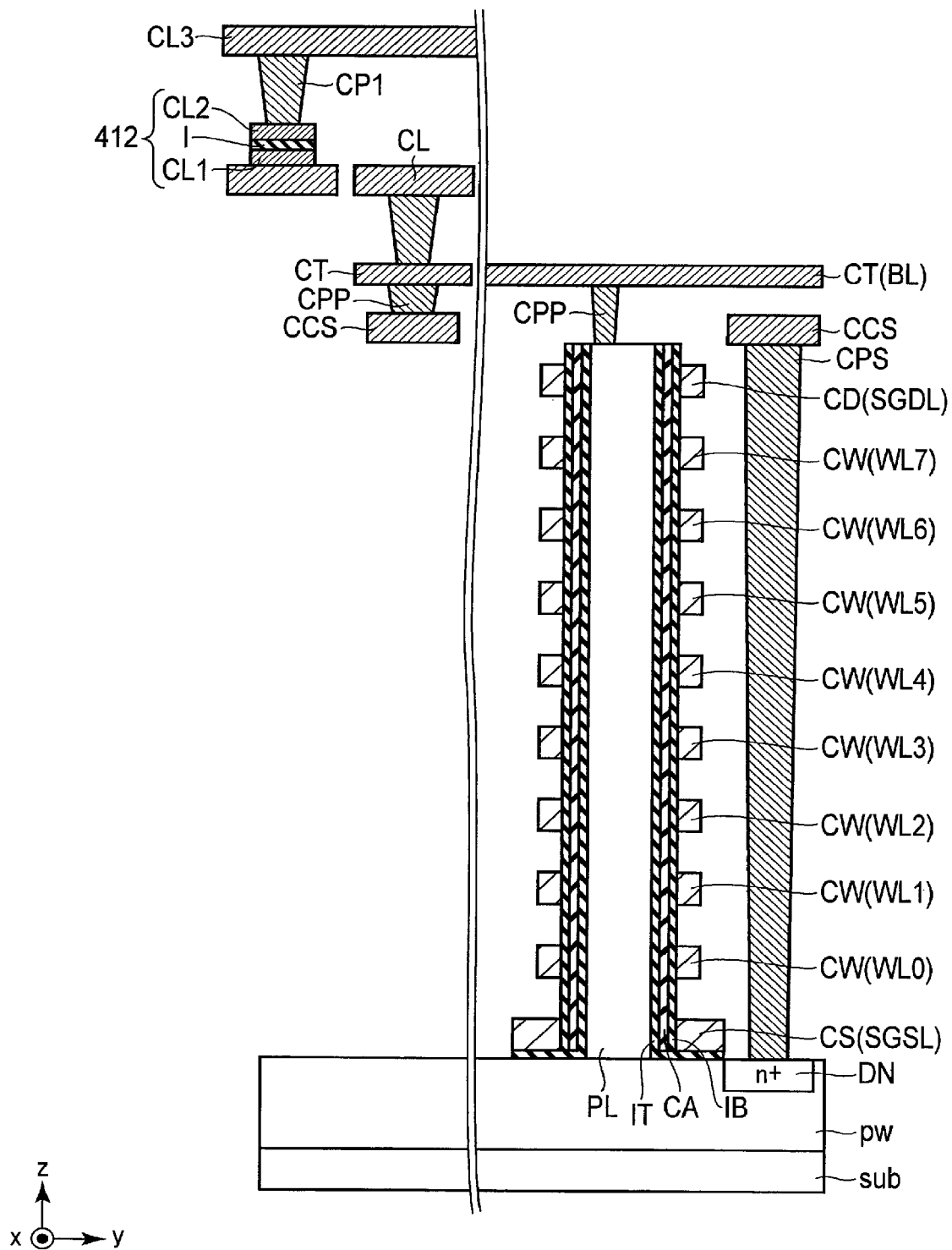
FIG. 28 illustrates a second example of the structure of the capacitive element of the third embodiment.

FIG. 28 illustrates a second example of the structure of the capacitive element 412 of the third embodiment, illustrates part of a cross-section along the yz-plane of the memory device 1, and includes part of FIG. 4. As illustrated in FIG. 28, the capacitive element 412 is formed of a conductor CL1 in a layer above a layer of the conductor CT, an insulator I, and a conductor CL2. The insulator I is located on the top of the conductor CL1, and the conductor CL2 is located on the top of the insulator I. The conductor CL2 is coupled to the node ND (see, FIG. 25 or 26) via components, such as a conductive plug CP1 and a conductor CL3.

FIG. 29 illustrates a third example of the structure of the capacitive element 412 of the third embodiment, illustrates part of a cross-section along the yz-plane of the memory device 1, and includes part of FIG. 4. The third example corresponds to the FIG. 24 example. As illustrated in FIG. 29, a pillar PL1 is provided. The pillar PL1 has the same structure and features as the pillar PL, which makes parts of cell transistors MT. The pillar PL1 is, at its bottom, in contact with the top of an insulator 412e on the substrate sub. A section 412d of the substrate sub below the insulator 412e, the insulator 412e, and a section 412f of the pillar PL1 above the insulator 412e make the capacitive element 412. The top of the pillar PL1 is coupled to the node ND (see, FIG. 25 or FIG. 26) via components, such as a plug CPP and a conductor CT.

<3-2. Operation>

In the FIG. 25 example, access to the memory device 1 turns on the transistor Tr4 in one detector 41 for an accessed block BLK, which charges the node ND by the node of the voltage VCC. The node ND has a charged voltage while a block BLK for which that node ND is provided (or, a block BLK corresponding to that node ND) is being accessed. While the block BLK corresponding to that node ND is being accessed, the rise of the voltage of the node ND charges the capacitive element 412. With the end of the access to the block BLK corresponding to the node ND, the charging of the node ND, and, by extension, the charging of the capacitive element 412, stops, which starts a fall of the voltage of the node ND. When the voltage of the node ND is lower than the reference voltage Vref, the operational amplifier OP1 outputs a low-level signal DS. When the bias control circuit 42 receives the low-level signal DS, it performs the WL bias to the block BLK for which the detector 41 outputting that signal DS is provided.

Moreover, the WL bias also accesses the corresponding block BLK, and therefore the capacitive element 412 is charged by WL bias. Then, when discharging the capacitive element 412 lowers the voltage of the node ND lower than or equal to the reference voltage Vref, the WL bias is performed again to the corresponding block BLK. Thus, the WL bias is repeatedly performed periodically.

Also in the FIG. 26 example, the same operation occurs as the FIG. 25 example. As described with reference to FIG. 25, the node ND and in turn the capacitive element 412 are charged while a block BLK for which that node ND is provided is being accessed. When the access to the block BLK corresponding to the node ND stops, the voltage of the node ND starts to fall. When the voltage of the node ND falls lower than or equal to a magnitude to turn on the transistor Tr1 (or, the reference), the signal DS transitions to the low level. When the bias control circuit receives the low-level signal DS, it performs the WL bias.

<3-3. Advantages>

According to the third embodiment, each detector 41 is coupled to the node ND which has a voltage which rises while a corresponding block BLK is being accessed, and to the capacitive element 412. With this, the corresponding block BLK being accessed charges the capacitive element 412, and the end of the access starts discharging the capacitive element 412, which lowers the voltage of the node ND. When the voltage of the node ND falls below the reference, the bias control circuit 42 performs the WL bias to the block BLK to which the detector 41 corresponds, as described in the first embodiment. The fall of the voltage of the node ND due to the discharging of the capacitive element 412 has a correlation with an elapsed time from the end of the access to the corresponding block BLK, and the WL bias is performed when a particular time passes from the end of the access to the block BLK. This allows the periodical WL bias to be performed to periodically bring back the voltage of the WL-biased word line WL to a state similar to a state with the coupling rise. This allows a data read to be performed with the voltage of the word line WL raised. This can produce the same advantages of the first embodiment, especially the same advantages as those obtained by the first example of the triggering condition.

Fourth Embodiment

The fourth embodiment relates to a method of triggering the WL bias, and details of the second embodiment.

<4-1. Structure (Configuration)>

FIG. 30 illustrates some of functional blocks of the memory device 1 of the fourth embodiment. The memory device 1 of the fourth embodiment includes the same functional blocks as the memory device 1 of the second embodiment, and further includes functional blocks illustrated in FIG. 30. FIG. 30 is similar to FIG. 21, which illustrates the functional blocks of the third embodiment. The detectors 41 all have the same components and connections. As illustrated in FIG. 30, the node 1N of each detector 41 is coupled to one block BLK, and more specifically to a particular node in a block BLK, as will be described. Each detector 41 is coupled to the bias control circuit 42 at a node 2N (2N0, 2N1, . . . ). The node 2N transmits a corresponding signal OPSEL (OPSEL1, OPSEL2, . . . ).

As in the third embodiment, each detector 41 is provided for one block (see, the FIG. 22) or a set of blocks (see, the FIG. 23).

FIG. 31 illustrates a first example of details of one detector 41 of the fourth embodiment. As illustrated in FIG. 31, the detector 41 includes an operational amplifier OP2 and an n-type MOSFET Tr10. The operational amplifier OP2 receives a reference voltage Vref at its inverting input, is coupled to a first end of the transistor Tr10 at its non-inverting input, and outputs the signal DS. The gate of the transistor Tr10 is the node 2N, and the transistor Tr10 receives a signal OPSEL from the bias control circuit 42 at its gate. A second end of the transistor Tr10 is the node 1N, and is coupled to one word line WLz (z being zero or a natural number) of a block BLK for which the detector 41 is provided. The coupled word line WLz may be any word line WL in the block BLK.

FIG. 32 illustrates a second example of details of one detector 41 of the fourth embodiment. As illustrated in FIG. 32, the detector 41 includes p-type MOSFETs Tr11 and Tr13, n-type MOSFETs Tr10 and Tr12, resistors R11 and R12, and an inverter circuit IV12. The first end of the transistor Tr10 is coupled to the gate of the transistor Tr11, instead of the operational amplifier in FIG. 31.

The transistors Tr13 and Tr11 are coupled in series between the node of the voltage VCC and a first end of the resistor R11. The first end of the resistor R11 is coupled to one end of the transistor Tr11 and to the gate of the transistor Tr12. A second end of the resistor R11 is grounded. The transistor Tr13 is coupled at its gate to the input of the inverter circuit IV12, which is coupled to a node 2N. The resistor R12 is coupled in series between the node of the voltage VCC and a first end of the transistor Tr12. The first end of transistor Tr12 is coupled to one end of the resistor R12 and serves as a node of the signal DS. A second end of the transistor Tr12 is grounded.

<4-2. Operation>

When the detector 41 receives a corresponding signal OPSEL of the high level, it is enabled and the transistor Tr10 turns on. When enabled, in the FIG. 31 example the voltage of the node 1N is transmitted to the non-inverting input terminal of the operational amplifier OP2. The operational amplifier OP2 outputs a high-level signal DS when the voltage of its non-inverting input terminal is higher than the reference voltage Vref (reference), and it outputs a low-level signal DS when the voltage of its non-inverting input terminal is lower than or equal to the reference voltage Vref.

The same operation as the FIG. 31 example occurs also in the FIG. 32 example. With the transistor Tr10 turned on, the voltage of the node 1N is transmitted to the gate of the transistor Tr11. The detector 41 outputs the high-level signal DS while the voltage of the node 1N is high enough not to turn on the transistor Ti11, and it outputs the low-level signal DS while the voltage of the gate of the transistor Tr11 has a magnitude lower than or equal to a magnitude for turning on the transistor Tr11 (or, reference).

FIG. 33 illustrates the flow of an operation of the memory device 1 of the fourth embodiment. The FIG. 33 flow starts with the memory device 1 receiving an instruction of a read from a cell unit CUy in a block BLKx (step S21). When the instruction is received by the memory device 1, the sequencer 13 makes high the signal OPSEL of the detector 41 for the block BLKx, to enable the detector 41 (step S22).

The detector 41 determines whether the voltage of the node 1N is equal to lower than the reference voltage Vref (step S23). With the voltage of the node 1N lower than or equal to the reference voltage Vref (Yes branch of step S23), word lines WL in the block BLKx are determined to have fallen voltages, not raised. This causes the WL bias control circuit 42 to perform the WL bias to the block BLKx (step S24). The description made in the first embodiment is applicable to the WL bias. In step S25, the sequencer 13 reads data from the cell unit CUy.

With the voltage of the node 1N higher than the reference voltage Vref (No branch of step S23), it is determined that word lines WL in the block BLKx have a raised voltage. This causes the WL bias control circuit 42 to not perform the WL bias to the block BLKx, i.e., the flow goes to step S25.

<4-3. Advantages>

According to the fourth embodiment, when the memory device 1 is instructed to perform a read from the cell unit CUy in the block BLKx, the detector 41 compares with the reference the voltage of a word line WL, which is one of the word lines WL of the block BLKx and coupled to that detector 41. With the voltage of the comparison-target word line WL lower than or equal to the reference, the sequencer 13 performs the WL bias to the block BLKx. The WL bias brings the voltage of the WL-biased word line WL back to a state similar to the state with the coupling rise. This allows for data to be read from a cell unit CU while the word lines of a block BLK to which the cell unit CU belongs have raised voltages. This can produce the same advantages as the first embodiment.

Fifth Embodiment

The fifth embodiment relates to the configuration of the combination of the first and fourth embodiments.

The memory controller 2 of the fifth embodiment includes the same functional blocks as the memory controller 2 of the first embodiment, and the memory device 1 of the fifth embodiment includes the same functional blocks as the memory device 1 of the fourth embodiment. In the fifth embodiment, however, the memory device 1, especially the sequencer 13, is configured to perform operations described in the following. Moreover, the memory device 1 includes k+1 (k being a natural number) detectors 41_0 to 41_k.

FIG. 34 illustrates the flow of an operation of the memory device 1 of the fifth embodiment. FIG. 34 is a sub-flow of step S6 of the FIG. 7 flow of the first embodiment with the first example of triggering condition applied. Specifically, when the triggering condition is satisfied in step S4, or, the time tWLB passes from the last WL bias instruction, the memory controller 2 instructs the WL bias to the memory device 1 in step S5. When the WL bias instruction is received by the memory device 1, the sequencer 13 enables plural (for example, all) detectors 41 one by one, and, based on the result of each detector 41, performs the WL bias to one or more blocks BLK for which that detector 41 is provided. A specific example for that is described with reference to FIG. 34.

Step S5 continues at step SS61, where the sequencer 13 sets a parameter i to i=0. In step SS62, the sequencer 13 makes a signal OPSELi for a detector 41_i high to enable the detector 41_i. In step SS63, the detector 41_i performs the WL bias to one or more blocks BLK for which the detector 41_i is provided as described in the fourth embodiment.

In step SS64, the sequencer 13 determines whether the parameter i is k. With i≠k (No branch of step SS64), the sequencer 13 makes i=i+1 in step SS65, and goes back to step SS62. In contrast, with i=k (Yes branch of step SS64), the flow goes to step S7.

According to the fifth embodiment, the WL bias is performed as in the first embodiment. This can produce the same advantages as the first embodiment, especially the same advantages as those with the first example of the triggering condition applied. Moreover, the fifth embodiment does not perform a determination on the necessity for the WL bias upon reception of a data-read instruction nor the WL bias when determined necessary, which is the case of the fourth embodiment, a process performed in response to a received data-read instruction completes earlier than in the fourth embodiment case.

Sixth Embodiment

The sixth embodiment relates to a WL bias continued from a data read.

The memory device 1 of the sixth embodiment has the same functional blocks as the memory device 1 of the first embodiment. In the sixth embodiment, however, the memory device 1, especially the sequencer 13 is configured to perform operations described in the following.

<6-1. Operation>

FIG. 35 illustrates an example of an operation performed by the memory device 1 in response to reception of a data read instruction from the memory controller 2, and relates to an example of storing of three-bit data in one cell transistor MT illustrated in FIG. 5.

As illustrated in FIG. 35, a data read instruction includes a command AAh, the command ooh, the address signal ADD, and the command 30h. The command AAh specifies a read-target page, and specifies an upper, middle, or lower page in the ongoing example. The address signal ADD specifies a cell unit CU which provides the memory space of the read-target page, or a selected cell unit CU. The command 30 instructs execution of the read. An instruction for a data read from a cell unit CU which stores one-page data does not include the command AAh.

Upon reception of the data read instruction, the memory device 1 applies the selected word line WL with one or more read voltages VCGR of different magnitudes based on the read-target page one after another. Specifically, for a example case of a read from the middle page, the sequencer 13 sequentially applies the read voltages VB, VD, and VF to the selected word line. While the read voltage VB, VD, or VF are being applied, the sequencer 13 determines the respective magnitude of a current flowing through each cell transistor MT, or a selected cell transistor MT, in the selected cell unit CU to obtain the data of the middle page. In a read of data from the upper or lower page, read voltages VCGR different from those for the upper-page case are applied to the selected word line WL. A similar principle applies to a data read from a selected cell unit CU storing data in one, two, or four or more pages, and one or more read voltages VCGR of different magnitudes are applied to the selected word line WL.

FIG. 36 illustrates voltages of some interconnects during a data read from a particular page in a selected cell unit CU of the memory device 1 of the sixth embodiment over time, and in particular illustrates voltages before the start of the data read and after the end of application of the last read voltage VCGR. The FIG. 36 operation occurs in response to reception of a data read instruction as illustrated in FIG. 35 received by the memory device 1. The change of the voltages at a time t31 in FIG. 36 is the same as that at the time t21 in FIG. 13. In FIG. 36 and the following description, the first read voltage VCGR from the time t31 is referred to as a read voltage VCGR1.

After the time t31, the selected word line WL is applied with one or more read voltages VCGR of magnitudes different from the read voltage VCGR1. The last read voltage VCGRn is applied at a time before a time t32. For a single-level read case, the read voltage VCGR1 is equal to the read voltage VCGRn.

The one-page data read of FIG. 36 in response to the data read instruction ends at or before the time t32, and data from the page is determined in the sense amplifier 16. Based on this, the sequencer 13 starts to apply the voltage VSS to the bit line BL, the select gate line SGDL of the selected string unit SU, and the source line CELSRC, from the time t32.

In contrast, the sequencer 13 keeps applying the voltages VREAD and VSG to the unselected word lines WL and the select gate line SGSL even after the time t32. The sequencer 13 further sets the voltage of the selected word line WL to the voltage VREAD from the time t32. The maintenance of the voltages of the select gate line SGSL and the selected and unselected word lines WL after the completion of the data read is contrastive to a data read for a case without the sixth embodiment applied. The voltages of the select gate line SGSL and the selected and unselected word lines WL in a data read for a case without the sixth embodiment applied are illustrated by the dotted lines for comparison.

The application of the voltages from the time t32 is continued until the cell array 10 is accessed next time based on some event, such as an instruction for a data read, write, or erasure received from the memory controller 2. Upon detection of the access, the sequencer 13 sets the voltages on the selected and unselected word lines WL and the select gate line SGSL back to the voltage VSS at a time t33 in order to prepare for the execution of the operation by the access.

FIG. 37 schematically illustrates one state of a part of the memory device 1 of the sixth embodiment during an operation, and illustrates a state of a string STR in the string unit SU0 during a data read from a particular page in the string unit SU0. In particular, FIG. 37 illustrates a state between the times t31 and t32 in the left-hand side portion, and a state between the times t32 and t33 in the right-hand side portion. The left-hand side portion illustrates an example of the cell transistor MT4 being selected and turned on.

As illustrated in FIG. 37, the select gate transistor DT0, the cell transistors MT0 to MT7, and the select gate transistor ST are ON between the times t31 and t32. For this reason, channels are formed in the select gate transistor DT0, the cell transistors MT0 to MT7, and the select gate transistor ST, which conducts a cell current through the select gate transistor DT0, the cell transistors MT0 to MT7, and the select gate transistor ST.

The cell transistors MT0 to MT7 and the select gate transistor ST are ON also between the times t32 and t33, which forms the channels in the cell transistors MT0 to MT7 and the select gate transistor ST. In contrast, the select gate transistor DT0 is OFF and no channel is formed in the select gate transistor DT0. Therefore, the cell transistor MT7 is electrically uncoupled from the bit line BL coupled to the string STR of FIG. 37, or a corresponding string STR, and a current does not flow between that bit line BL and the source line CELSRC.

As described above, the turned-off select gate transistor DT electrically uncouples the corresponding bit line BL and the source line CELSRC. For this reason, the state in the right-hand side portion of FIG. 37 is not influenced by the states of other interconnects. For example, the bit line BL may electrically float, or the bit line BL and/or the source line CELSRC may be at a voltage higher than the voltage VSS.

<6-2. Advantages>

According to the sixth embodiment, when the memory device 1 is instructed to read data from a particular page of a selected cell unit CU, it sets the voltage of the select gate line SGDL of a string unit SU including the selected cell unit CU back to the voltage VSS, but keeps applying the voltage VREAD to unselected and selected word lines WL and the voltage VSG to the select gate line SGSL even after it obtains the instructed data. This can suppress the coupling rise of the voltage of the selected word line WL due to the fall of the voltage of the selected word line WL as described with reference to FIG. 16. Moreover, the channel regions of the cell transistors MT0 to MT7 and the select gate transistor ST are electrically coupled to the substrate sub, which allows charge carriers to move between the channel regions and the substrate sub even after a data read. These suppression of the coupling rise and/or the securement of the mobility of the charge carriers can suppress incorrect reads of data from the cell unit CU.

Moreover, according to the sixth embodiment, the suppression of incorrect data reads through the suppression of the coupling rise and/or the securement of the mobility of the charge carriers due to formed channels can be realized with reduced consumption of current as described in the following.

Figure 38:
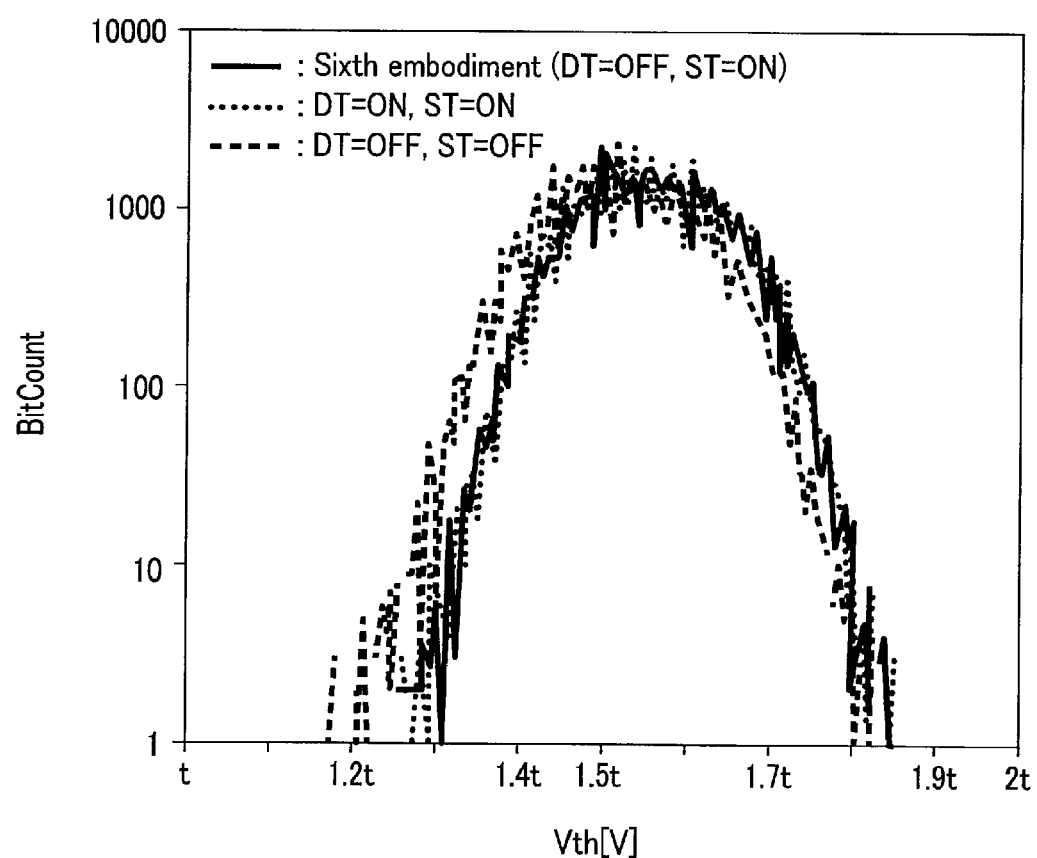
FIG. 38 illustrates a distribution of threshold voltages of cell transistors in the sixth embodiment.

FIG. 38 illustrates a particular distribution of the threshold voltages of cell transistors MT in the sixth embodiment. FIG. 38 also illustrates threshold voltage distributions in other cases by a dotted line and a dashed line. The dashed line indicates a state after the ordinary data read, i.e., it illustrates a threshold distribution in a case of the select gate transistors ST and DT being turned off after a data read. Specifically, the dashed line indicates that the threshold distribution has changed from immediately after a write to cell transistors MC due to the coupling rise and/or the restricted mobility of the charge carriers because of the absence of channels, etc. The dotted line indicates the threshold voltage distribution in a case where a state similar to that of a data read is periodically formed after a data read, for example as the WL bias of the first embodiment. More specifically, the dotted line indicates the threshold voltage distribution in a case where application of the voltage VREAD to the selected and unselected word lines WL and application of the voltage VSG to the select gate transistors ST and DT are periodically performed after a data read.

As illustrated with the dotted-line, the application of the voltage VREAD to the word lines WL and remaining on of the select gate transistors ST and DT keep the shape of the threshold voltage distribution from changing as opposed to the dashed-line threshold voltage distribution. Thus, the application of the voltage VREAD to the word lines WL and remaining on of the select gate transistors ST and DT can also suppress the change of the shape of the threshold voltage distribution through suppression of the coupling rise and/or the secured mobility of the charge carriers via formed channels, etc. With such WL bias, however, the bit line BL and the source line CELSRC are electrically coupled, and current flows between the bit line BL and the source line CELSRC during the WL bias, which leads to a high consumption current in the memory device 1.

According to the sixth embodiment, the select gate transistor DT remains off, and therefore a current does not flow through a string STR even when the voltages are applied to the selected and unselected word lines WL and the select gate transistor ST during periods other than data reads. For this reason, incorrect data read can be suppressed through the application of the voltages to the selected and unselected word lines WL and the select gate transistor ST without an increase in consumed current. In addition, substantially the same threshold voltage distribution as that through the control accompanied by remaining on of both the select gate transistors ST and DT can be maintained as illustrated by the solid line of FIG. 38 in the sixth embodiment.

<6-3. Modification>

The modification relates to application of the sixth embodiment to a structure including dummy cell transistors and a dummy word line therein.

As illustrated in FIG. 39, each string STR includes the components and connections described with reference to FIG. 3, and further includes a dummy cell transistor DMT between the select gate transistor DT and cell transistor MT7. The dummy cell transistor MT is not used to store data, and is coupled to a dummy word line DWL at its gate. Two or more dummy cell transistors DWL may also be provided.

Figure 40:
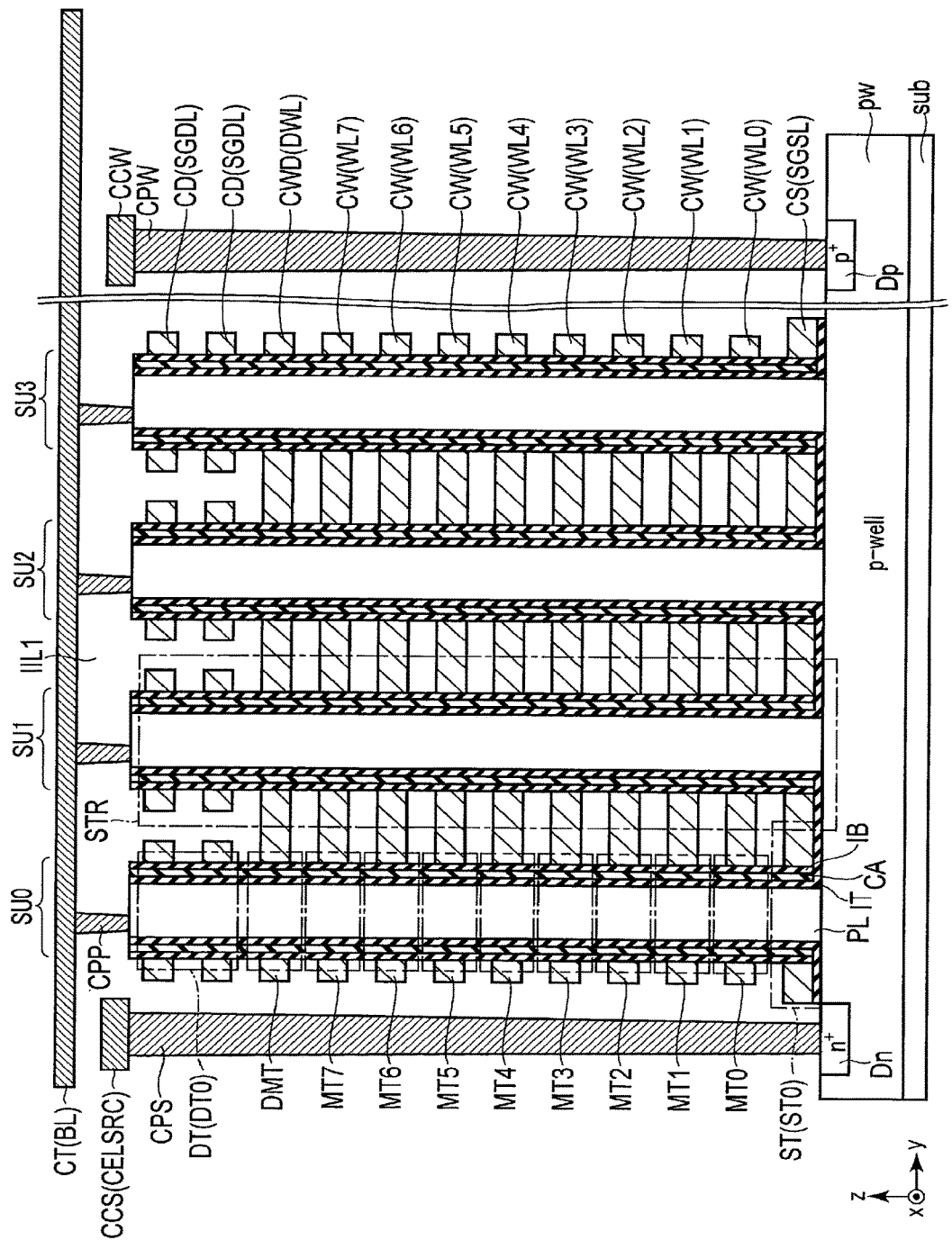
FIG. 40 illustrates an example of the structure of a block of the modification of the sixth embodiment.

The dummy cell transistors DMT have the same structure as the cell transistor MT, as illustrated in FIG. 40. Each string unit SU includes the structure described with reference to FIG. 4, and further includes a conductor CWD between the highest conductor (serving as the word line WL7) CW and the lowest conductor CD. The conductors CWD serve as the dummy word line DWL. In each string unit SU, the conductor CWD is at its inside in contact with the respective block insulators IB on the sides of all pillars PL in that string unit SU. A set of sections of a pillar PL, a tunnel insulator IT, a charge storage layer CA, and a block insulator IB at crossing with a conductor CWD serves as a dummy cell transistor DMT.

Figure 41:
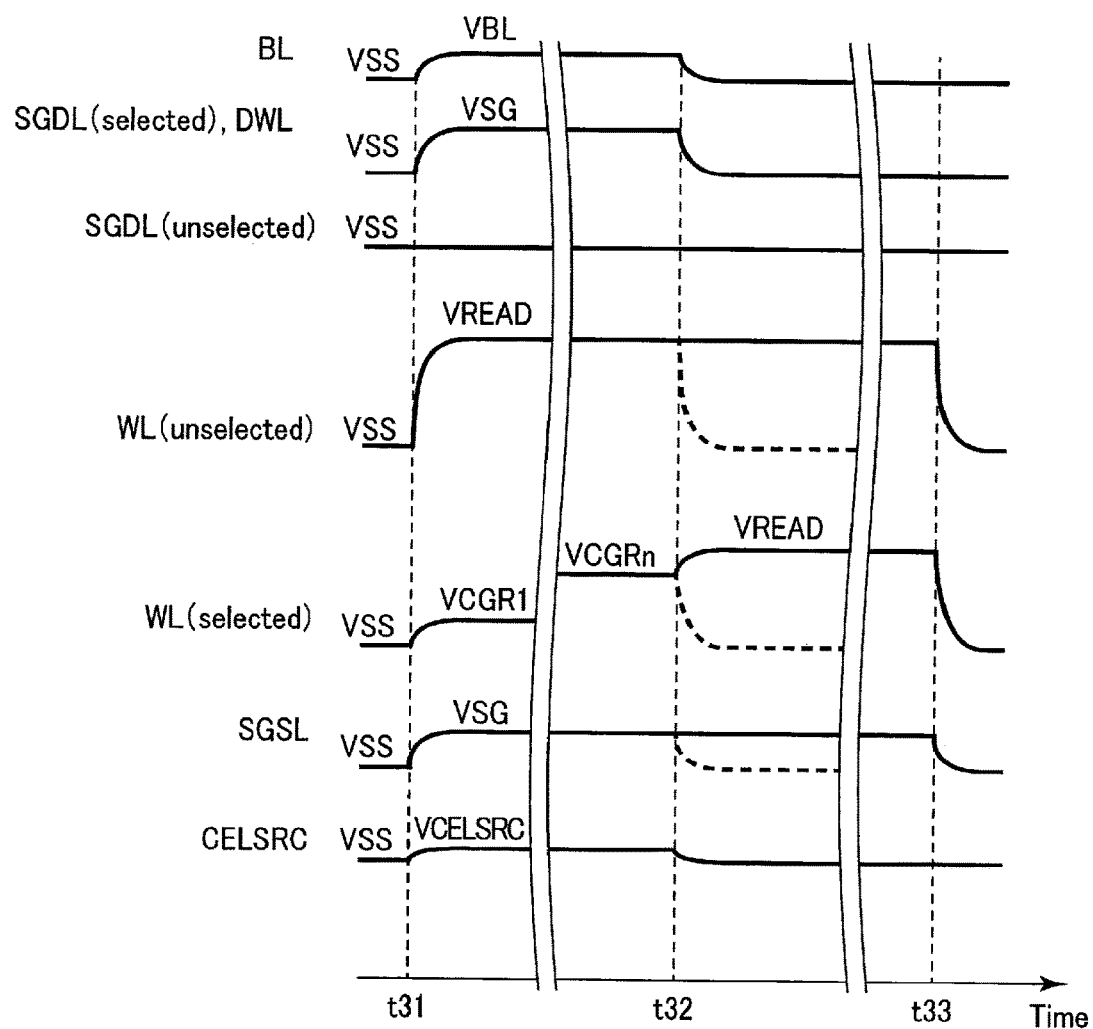
FIG. 41 illustrates voltages of some interconnects of the memory device of the modification of the sixth embodiment during a data read over time.

FIG. 41 is similar to FIG. 36, illustrates voltages of some interconnects during a data read in the memory device 1 of the modification over time, and in particular illustrates voltages from before the start of a data read after the end of application of the last read voltage VCGR. As illustrated in FIG. 41, the dummy word line DWL is applied with the same voltage as the select gate line SGDL. Specifically, the dummy word line DWL is applied with the voltage VSG from the time t31 to the time t32, and the voltage VSS from the time t32.

When a dummy cell transistor DMT and a dummy word line DWL are provided as in the modification, the dummy word line DWL is applied with the same voltage as the select gate line SGDL. With such application of voltage, the channels of the cell transistors MT0 to MT7 and the select gate transistor ST are electrically coupled to the substrate sub and a current does not flow through the string STR also according to the modification. For this reason, the advantages of the sixth embodiment can be obtained even with the dummy cell transistors DMT and the dummy word lines DWL.

When a dummy cell transistor is provided at the side of the select gate transistor ST, that dummy cell transistor is controlled in the same manner as the cell transistors MT. Specifically, one or more dummy cell transistors DMT are provided between the cell transistor MT0 and the select gate transistor ST, and those dummy cell transistors DMT are coupled to a dummy word line DSWL at their gates. The dummy word line DSWL is applied with the same voltage as the word lines WL during the FIG. 41 operation.

At least one of the embodiments described above can include, without being limited to, the following configurations.

[1] A memory device comprising:
cell transistors coupled in series;
word lines respectively coupled to respective gates of the cell transistors; and
a controller configured to apply a first voltage to at least one of the word lines in response to a first instruction which accompanies no data to be written to the cell transistors, the first voltage being lower than a second voltage applied to a word line coupled to a first one of the cell transistors in a data write to the first cell transistor.

[2] The device according to [1], wherein the first voltage is a voltage applied to a word line coupled to a second one of the cell transistors in the data write to the first cell transistor, and the second cell transistor is different from the first cell transistor.

[3] The device according to [1], wherein:
the memory device further comprises a first transistor coupled to a bit line, and a second transistor coupled to a source line,
the cell transistors are serially coupled between the first transistor and the second transistor, and
the controller is further configured to apply the first voltage to one of the word lines without applying the second voltage to any one of the word lines in response to the first instruction.

[4] A memory device comprising:
cell transistors;
word lines respectively coupled to respective gates of the cell transistors; and
a controller configured to perform a first process with no command received from outside the memory device after the controller receives an instruction for access to one of the cell transistors from outside the memory device, the first process including application of a positive first voltage to one of the word lines when a first condition is satisfied.

[5] The device according to [4], wherein the first voltage is a voltage applied to one of the word lines coupled to a first one of the cell transistors during a read of data from the first cell transistor.

[6] The device according to [4], wherein the controller is further configured to perform the first process every time a first period lapses.

[7] The device according to [4], wherein the controller is further configured to perform the first process when a detected temperature exceeds a reference.

[8] The device according to [4], wherein the controller is further configured to perform the first process when a first temperature detected after detection of a second temperature has a larger difference from the second temperature than a reference.

[9] A memory device comprising:
a first transistor;
a second transistor;
a first cell transistor and a second cell transistor coupled in series between the first and second transistors;
a first select gate line coupled to a gate of the first transistor;
a second select gate line coupled to a gate of the second transistor;
a first word line coupled to a gate of the first cell transistor;
a second word line coupled to a gate of the second cell transistor; and
a controller configured to:
apply the first select gate line with a first voltage to a first time, a second voltage higher than the first voltage between the first time and a second time, the first voltage from the second time,
apply a third voltage higher than the first voltage to the first and second word lines while applying the first voltage to the first select gate line, and
apply a fourth voltage higher than the first voltage to the second select gate line while applying the first voltage to the first select gate line and applying the third voltage to the first and second word lines.

[10] The memory device according to [9], wherein the controller is further configured to apply the third voltage to the first and second word lines while applying the first voltage to the first select gate line from the second time.

[11] The memory device according to [9], wherein the third voltage has a magnitude to turn on the first and second cell transistors.

[12] The memory device according to [9], wherein the controller is further configured to apply the first and second word lines with a fifth voltage higher than the first voltage and lower than the third voltage between the first and second times.

[13] The memory device according to [9], wherein the controller is further configured to perform the application of the first, second, third, and fourth voltages when the controller receives an instruction to read data from the first or second cell transistor.

[14] The memory device according to [9], wherein the first voltage has a magnitude to turn off the first transistor, the second voltage has a magnitude to turn on the first transistor, and the fourth voltage has a magnitude to turn on the second transistor.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A memory controller comprising:
a processor; and
a memory interface, wherein
the processor causes the memory interface to
transmit a first instruction to a memory device, the memory device comprising cell transistors coupled in series, word lines respectively coupled to respective gates of the cell transistors, a first data latch, and a second latch, the first instruction instructing application of a positive voltage to one of the word lines, and
transmit a second instruction after the transmission of the first instruction and before transmitting a third instruction, the third instruction instructing output of data from the memory device, the second instruction being different from the third instruction and a fourth instruction instructing copy of data from the first data latch to the second data latch,
the memory device comprising a block including the cell transistors, and
the processor further causes the memory interface to transmit the first instruction in response to the count of reads of data from cell transistors in the block or the count of erasures of data in cell transistors in the block exceeding a reference.

2. The controller according to claim 1, wherein the first instruction instructs reading data from one of the cell transistors.

3. The controller according to claim 1, wherein:
one of the cell transistors coupled to the word line stores data of bits, and
the first instruction instructs reading data from the cell transistor without specifying one of the bits.

4. The controller according to claim 1, wherein the processor further causes the memory interface to transmit the first instruction to the memory device every time a first period lapses.

5. The controller according to claim 1, wherein the processor further causes the memory interface to transmit the first instruction to the memory device when a detected temperature exceeds a reference.

6. The controller according to claim 1, wherein the processor further causes the memory interface to instruct reading data in the memory device following the transmission of the first instruction.

7. A memory controller comprising:
a processor; and
a memory interface, wherein
the processor causes the memory interface to
transmit a first instruction to a memory device, the memory device comprising cell transistors coupled in series, word lines respectively coupled to respective gates of the cell transistors, a first data latch, and a second latch, the first instruction instructing application of a positive voltage to one of the word lines,
transmit a second instruction after the transmission of the first instruction and before transmitting a third instruction, the third instruction instructing output of data from the memory device, the second instruction being different from the third instruction and a fourth instruction instructing copy of data from the first data latch to the second data latch, and transmit the first instruction to the memory device when a first temperature detected after detection of a second temperature has a larger difference from the second temperature than a reference.

8. The controller according to claim 7, wherein the first instruction instructs reading data from one of the cell transistors.

9. The controller according to claim 7, wherein:

one of the cell transistors coupled to a word line stores data of bits, and the first instruction instructs reading data from the cell transistor without specifying one of the bits.

10. The controller according to claim 7, wherein the processor further causes the memory interface to transmit the first instruction to the memory device every time a first period lapses.

11. The controller according to claim 7, wherein the processor further causes the memory interface to transmit the first instruction to the memory device when a detected temperature exceeds a reference.

12. The controller according to claim 7, wherein the processor further causes the memory interface to instruct reading data in the memory device following the transmission of the first instruction.

13. A memory controller comprising:

a processor; and a memory interface, wherein the processor causes the memory interface to transmit a first instruction to a memory device, the memory device comprising cell transistors coupled in series, word lines respectively coupled to respective gates of the cell transistors, a first data latch, and a second latch, the first instruction instructing application of a positive voltage to one of the word lines;

transmit a second instruction after the transmission of the first instruction and before transmitting a third instruction, the third instruction instructing output of data from the memory device, the second instruction being different from the third instruction and a fourth instruction instructing copy of data from the first data latch to the second data latch; and instruct reading data in the memory device before without transmitting the third instruction after the transmission of the first instruction.

14. The controller according to claim 13, wherein the first instruction instructs reading data from one of the cell transistors.

15. The controller according to claim 13, wherein:

one of the cell transistors coupled to a word line stores data of bits, and the first instruction instructs reading data from the cell transistor without specifying one of the bits.

16. The controller according to claim 13, wherein the processor further causes the memory interface to transmit the first instruction to the memory device every time a first period lapses.

17. The controller according to claim 13, wherein the processor further causes the memory interface to transmit the first instruction to the memory device when a detected temperature exceeds a reference.

18. The controller according to claim 13, wherein the processor further causes the memory interface to instruct reading data in the memory device following the transmission of the first instruction.

19. The controller according to claim 13, wherein:

the first instruction instructs reading data from one of the cell transistors, one of the cell transistors coupled to a word line stores data of bits, the first instruction instructs reading data from the cell transistor without specifying one of the bits, the processor further causes the memory interface to transmit the first instruction to the memory device every time a first period lapses, the memory device comprising a block including the cell transistors, the processor further causes the memory interface to transmit the first instruction when the count of reads of data from cell transistors in the block or the count of erasures of data in cell transistors in the block exceeds a reference, the processor further causes the memory interface to transmit the first instruction to the memory device when a detected temperature exceeds a reference, the processor further causes the memory interface to transmit the first instruction to the memory device when a first temperature detected after detection of a second temperature has a larger difference from the second temperature than a reference, and the processor further causes the memory interface to instruct reading data in the memory device following the transmission of the first instruction.

* * * * *